(12) United States Patent
Maki

(10) Patent No.: US 10,492,300 B2
(45) Date of Patent: Nov. 26, 2019

(54) LIGHT-EMITTING MODULE

(71) Applicant: TOSHIBA HOKUTO ELECTRONICS CORPORATION, Asahikawa-Shi (JP)

(72) Inventor: Keiichi Maki, Suita (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 0 days.

(21) Appl. No.: 15/824,059

(22) Filed: Nov. 28, 2017

(65) Prior Publication Data

US 2018/0092217 A1 Mar. 29, 2018

Related U.S. Application Data

(63) Continuation of application No. PCT/JP2016/002650, filed on Jun. 1, 2016.

(30) Foreign Application Priority Data

Jun. 1, 2015 (JP) ................. 2015-111782

(51) Int. Cl.
*H01L 33/62* (2010.01)
*H05K 1/18* (2006.01)
(Continued)

(52) U.S. Cl.
CPC ............. *H05K 1/189* (2013.01); *F21S 2/00* (2013.01); *F21V 19/00* (2013.01); *F21V 19/001* (2013.01);
(Continued)

(58) Field of Classification Search
CPC ......... H05K 1/189; H01L 24/81; H01L 33/62; H01L 2224/16135; H01L 33/56;
(Continued)

(56) References Cited

U.S. PATENT DOCUMENTS 7,592,681 B2  9/2009 Nakayama
8,609,444 B2  12/2013 Wada et al.
(Continued)

FOREIGN PATENT DOCUMENTS

JP    H10-163258 A1   6/1998
JP    2001-176908 A1  6/2001
(Continued)

OTHER PUBLICATIONS

International Search Report and Written Opinion (Application No. PCT/JP2016/002650) dated Aug. 16, 2016.
(Continued)

*Primary Examiner* — Thanh T Nguyen
(74) *Attorney, Agent, or Firm* — Burr & Brown, PLLC

(57) ABSTRACT

A light-emitting module includes: a first flexible insulating substrate having a plurality of conductor patterns formed on a surface; and a light-emitting element having a first electrode placed in a first region on a surface facing the first insulating substrate and connected to a first conductor pattern out of the plurality of conductor patterns through a first bump, and a second electrode placed in a second region different from the first region on a surface facing the first insulating substrate and connected to a second conductor pattern different from the first conductor pattern through a second bump, wherein a ratio of a distance from the first region to a contact point between the first bump and the first conductor pattern against a distance from the first electrode to a position where an outer edge of the first conductor pattern intersects with an outer edge of the second region is equal to or greater than 0.1.

15 Claims, 21 Drawing Sheets

(51) Int. Cl.
*F21S 2/00* (2016.01)
*F21V 19/00* (2006.01)
*F21V 23/00* (2015.01)
*H01L 23/00* (2006.01)
*F21Y 115/10* (2016.01)
*H01L 33/56* (2010.01)
*H01L 25/075* (2006.01)

(52) U.S. Cl.
CPC .............. *F21V 23/00* (2013.01); *H01L 24/81* (2013.01); *H01L 33/62* (2013.01); *H05K 1/186* (2013.01); *F21Y 2115/10* (2016.08); *H01L 25/0753* (2013.01); *H01L 33/56* (2013.01); *H01L 2224/16135* (2013.01); *H01L 2224/16225* (2013.01); *H01L 2224/32225* (2013.01); *H01L 2224/95* (2013.01); *H01L 2924/01079* (2013.01); *H01L 2924/181* (2013.01); *H05K 2201/10106* (2013.01); *H05K 2203/0278* (2013.01)

(58) Field of Classification Search
CPC . H01L 2924/01079; H01L 2224/32225; H01L 2224/95; H01L 2224/162; F21V 19/001; F21V 19/00; F21V 23/00; F21S 2/00; F21Y 2115/10
See application file for complete search history.

(56) References Cited

U.S. PATENT DOCUMENTS

| | | | |
|---|---|---|---|
| 9,306,132 B2 | 4/2016 | Maki | |
| 9,627,594 B2 | 4/2017 | Maki | |
| 9,837,587 B2 | 12/2017 | Maki | |
| 2008/0023784 A1 | 1/2008 | Nakayama | |
| 2010/0219444 A1 | 9/2010 | Wada et al. | |
| 2013/0341592 A1* | 12/2013 | Lee | ........................ H01L 27/153 257/13 |
| 2015/0041844 A1 | 2/2015 | Okahisa et al. | |
| 2016/0013376 A1* | 1/2016 | Maki | .................... H01L 25/0753 257/88 |
| 2016/0027973 A1 | 1/2016 | Maki | |
| 2016/0155913 A1 | 6/2016 | Maki | |
| 2016/0276561 A1 | 9/2016 | Maki | |
| 2018/0076364 A1 | 3/2018 | Maki | |

FOREIGN PATENT DOCUMENTS

| | | |
|---|---|---|
| JP | 2008-034505 A1 | 2/2008 |
| JP | 2009071159 A | 4/2009 |
| JP | 2010-226086 A1 | 10/2010 |
| JP | 2011-228463 A1 | 11/2011 |
| JP | 2012-084855 A1 | 4/2012 |
| JP | 2014-160880 A1 | 9/2014 |
| JP | 2015-035438 A1 | 2/2015 |
| WO | 2009/034793 A1 | 3/2009 |
| WO | 2014/156159 A1 | 10/2014 |
| WO | 2014/157455 A1 | 10/2014 |
| WO | 2015/083365 A1 | 6/2015 |

OTHER PUBLICATIONS

Supplemental European Search Report from a corresponding European patent application (EP 16802810.8) dated Feb. 15, 2019, 10 pages.

* cited by examiner

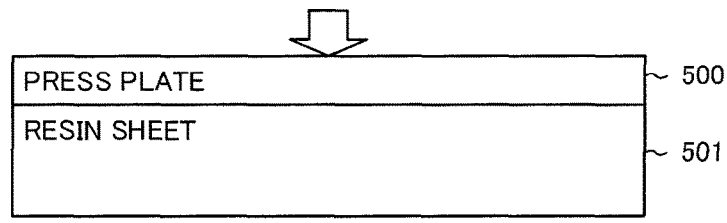
FIG.8A
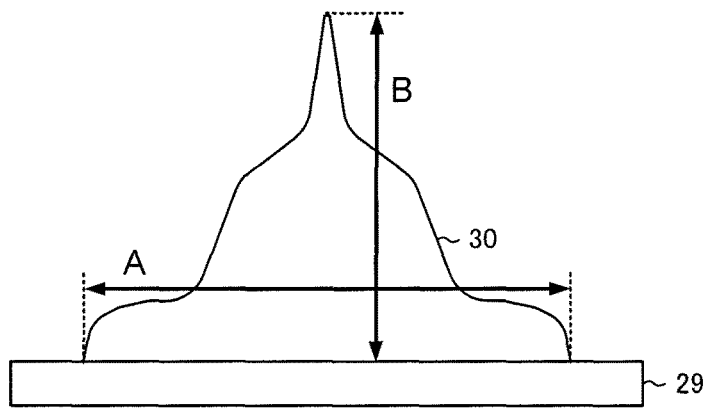
FIG.8B
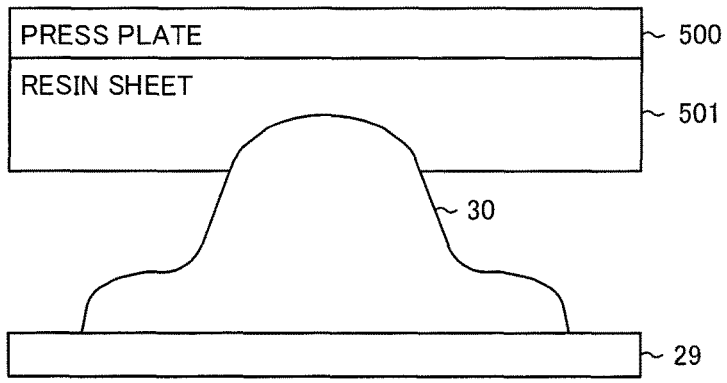
FIG.8C
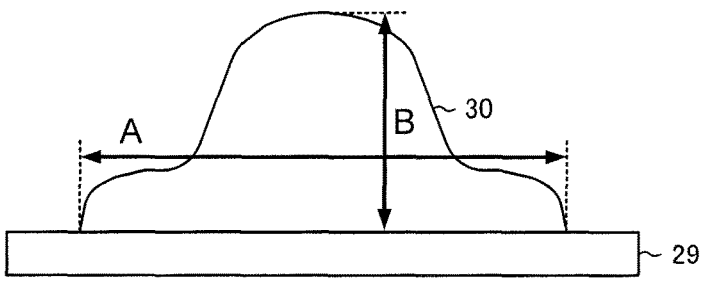

FIG.18

TABLE 1

| | CHIP SIZE | BUMP HEIGHT | DISTANCE a | CHIP AND BUMP POSITIONS | DISTANCE b | a/b | BENDING TEST | | THERMAL CYCLING TEST | |
|---|---|---|---|---|---|---|---|---|---|---|
| | μm □ | μm | μm | | μm | | BENDING RADIUS (mm) | NUMBER OF SAMPLES | CYCLE | NUMBER OF SAMPLES |
| EX.1 | 220 | 20 | 22 | D-LINE/CORNER | 180 | 0.122 | 20 | 6/6 | 3000 | 6/6 |
| EX.2 | 220 | 30 | 32 | D-LINE/CORNER | 180 | 0.178 | 20 | 6/6 | 3000 | 6/6 |
| EX.3 | 350 | 30 | 32 | D-LINE/CORNER | 310 | 0.103 | 20 | 6/6 | 3000 | 6/6 |
| EX.4 | 220 | 40 | 42 | D-LINE/CORNER | 180 | 0.233 | 20 | 6/6 | 3000 | 6/6 |
| EX.5 | 350 | 40 | 42 | D-LINE/CORNER | 310 | 0.135 | 20 | 6/6 | 3000 | 6/6 |
| EX.6 | 220 | 50 | 52 | D-LINE/CORNER | 180 | 0.289 | 20 | 6/6 | 3000 | 6/6 |
| EX.7 | 350 | 50 | 52 | D-LINE/CORNER | 310 | 0.168 | 20 | 6/6 | 3000 | 6/6 |
| EX.8 | 220 | 40 | 42 | D-LINE/CORNER | 150 | 0.280 | 20 | 6/6 | 3000 | 6/6 |
| EX.9 | 350 | 40 | 42 | D-LINE/CORNER | 270 | 0.156 | 20 | 6/6 | 3000 | 6/6 |
| COMP.1 | 220 | 5 | 7 | D-LINE/CORNER | 180 | 0.039 | 40 | 0/6 | 3000 | 0/6 |
| COMP.2 | 350 | 5 | 7 | D-LINE/CORNER | 310 | 0.023 | 40 | 0/6 | 3000 | 0/6 |
| COMP.3 | 220 | 10 | 12 | D-LINE/CORNER | 180 | 0.067 | 40 | 0/6 | 3000 | 0/6 |
| COMP.4 | 350 | 10 | 12 | D-LINE/CORNER | 310 | 0.039 | 40 | 0/6 | 3000 | 0/6 |
| COMP.5 | 220 | 15 | 17 | D-LINE/CORNER | 180 | 0.094 | 30 | 1/6 | 3000 | 0/6 |
| COMP.6 | 220 | 60 | 62 | D-LINE/CORNER | 180 | 0.344 | 30 | 2/6 | 3000 | 0/6 |
| COMP.7 | 220 | NO BUMP | — | — | — | — | 40 | 0/6 | 3000 | 0/6 |
| COMP.8 | 350 | NO BUMP | — | — | — | — | 40 | 0/6 | 3000 | 0/6 |

※D-LINE/CORNER : ON DIAGONAL LINE OF CHIP AND IN CORNER

FIG. 19

TABLE 2

| | CHIP SIZE μm□ | BUMP HEIGHT μm | DISTANCE a μm | CHIP AND BUMP POSITIONS | DISTANCE b μm | a/b | BENDING TEST | | THERMAL CYCLING TEST | |
|---|---|---|---|---|---|---|---|---|---|---|
| | | | | | | | BENDING RADIUS (mm) | NUMBER OF SAMPLES | CYCLE | NUMBER OF SAMPLES |
| EX.1 | 220 | 20 | 22 | CENTER OF CHIP | 156 | 0.141 | 20 | 6/6 | 3000 | 6/6 |
| EX.2 | 220 | 30 | 32 | CENTER OF CHIP | 156 | 0.206 | 20 | 6/6 | 3000 | 6/6 |
| EX.3 | 350 | 30 | 32 | CENTER OF CHIP | 247 | 0.129 | 20 | 6/6 | 3000 | 6/6 |
| EX.4 | 220 | 40 | 42 | CENTER OF CHIP | 156 | 0.270 | 20 | 6/6 | 3000 | 6/6 |
| EX.5 | 350 | 40 | 42 | CENTER OF CHIP | 247 | 0.170 | 20 | 6/6 | 3000 | 6/6 |
| EX.6 | 220 | 50 | 52 | CENTER OF CHIP | 156 | 0.334 | 20 | 6/6 | 3000 | 6/6 |
| EX.7 | 350 | 50 | 52 | CENTER OF CHIP | 247 | 0.210 | 20 | 6/6 | 3000 | 6/6 |
| COMP.1 | 220 | 5 | 7 | CENTER OF CHIP | 156 | 0.045 | 40 | 0/6 | 3000 | 0/6 |
| COMP.2 | 350 | 5 | 7 | CENTER OF CHIP | 247 | 0.028 | 40 | 0/6 | 3000 | 0/6 |
| COMP.3 | 220 | 10 | 12 | CENTER OF CHIP | 156 | 0.077 | 40 | 0/6 | 3000 | 0/6 |
| COMP.4 | 350 | 10 | 12 | CENTER OF CHIP | 247 | 0.048 | 40 | 0/6 | 3000 | 0/6 |
| COMP.5 | 220 | 20 | 22 | 3/4 POSITION FROM UPPER END OF DIAGONAL LINE OF CHIP | 233 | 0.094 | 30 | 1/6 | 3000 | 0/6 |
| COMP.6 | 350 | 20 | 22 | CENTER OF CHIP | 247 | 0.089 | 30 | 0/6 | 3000 | 0/6 |
| COMP.7 | 220 | 60 | 65 | CENTER OF CHIP | 156 | 0.417 | 20 | 4/6 | 3000 | 0/6 |
| COMP.8 | 220 | NO BUMP | — | — | — | — | 40 | 0/6 | 3000 | 0/6 |
| COMP.9 | 350 | NO BUMP | — | — | — | — | 40 | 0/6 | 3000 | 0/6 |

LIGHT-EMITTING MODULE

CROSS-REFERENCE TO RELATED APPLICATION

This application is continuation of International Application No. PCT/JP2016/002650, filed on Jun. 1, 2016, which is based upon and claims the benefit of priority from the prior Japanese Patent Application No. 2015-111782 filed on Jun. 1, 2015. The entire specification, claims, and drawings of Japanese Patent Application No. 2015-111782 are herein incorporated in this specification by reference.

FIELD

Embodiments of the present disclosure relate to a light-emitting module.

BACKGROUND

A light-emitting module using a light-emitting element (LED) is widely used for indoor, outdoor, stationary, moving, and other optical devices such as display devices, display lamps, various switches, signal devices, and general lightings. Among the light-emitting modules using the LEDs, as a device suitable for a display device or a display lamp for displaying various character strings, geometrical figures, patterns, or the like, there is known a light-emitting module having a plurality of LEDs arranged between a pair of light transmissive substrates.

Such a type of the light-emitting module has, for example, a light transmissive substrate having a circuit pattern formed on a surface, an LED connected to the circuit pattern, and a resin layer for holding the LED on the light transmissive substrate. The light transmissive substrate or the resin layer has flexibility. For this reason, the light-emitting module may be used in a curved or bent state.

When the light-emitting module is curved or bent, it is necessary to improve connection reliability of the circuit pattern by preventing disconnection of the circuit pattern or short-circuiting between the circuit patterns in advance.

BRIEF DESCRIPTION OF THE DRAWINGS

FIG. 8A is a diagram for describing bump rounding treatment;

FIG. 8B is a diagram for describing bump rounding treatment;

FIG. 8C is a diagram for describing bump rounding treatment;

FIG. 18 is a diagram illustrating a test result obtained through a bending test and a thermal cycling test;

FIG. 19 is a diagram illustrating a test result obtained through a bending test and a thermal cycling test;

DETAILED DESCRIPTION

First Embodiment

Figure 1:
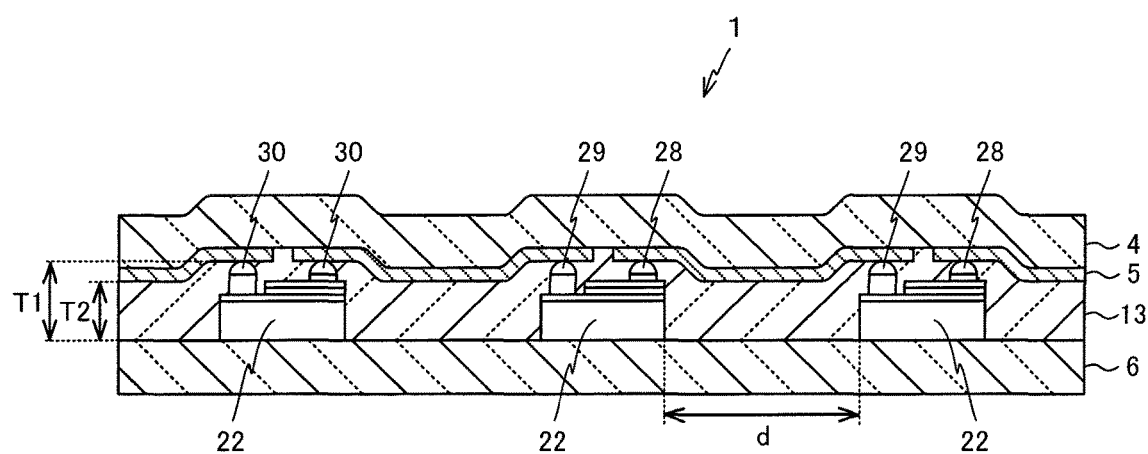
FIG. 1 is a cross-sectional view illustrating a light-emitting module according to a first embodiment.

A light-emitting module according to a first embodiment of the present disclosure will be described with reference to the accompanying drawings. FIG. 1 is a schematic cross-sectional view illustrating a schematic configuration of a light-emitting module 1 according to the embodiment.

As illustrated in FIG. 1, the light-emitting module 1 has a set of light transmissive films 4 and 6, a resin layer 13 formed between the light transmissive films 4 and 6, and a plurality of light-emitting elements 22 arranged inside the resin layer 13.

The light transmissive films 4 and 6 are rectangular films whose longitudinal directions extend in a horizontal direction on a paper surface of the drawing. The light transmissive films 4 and 6 have a thickness of approximately 50 to 300 μm and are light transmissive to visible light. The light transmissive films 4 and 6 preferably have a total light transmittance of approximately 5 to 95%. Note that the total light transmittance refers to transmittance of total light measured in accordance with Japanese Industrial Standard JIS K7375:2008.

The light transmissive films 4 and 6 have flexibility, and its flexural modulus is set to approximately 0 to 320 kgf/mm$^2$ (not including zero). Note that the flexural modulus is a value measured on the basis of a method complying with ISO 178 (JIS K7171:2008).

The light transmissive films 4 and 6 may be formed of polyethylene terephthalate (PET), polyethylene naphthalate (PEN), polycarbonate (PC), polyethylene succinate (PES), ARTON, acrylic resin, or the like.

A plurality of conductor patterns 5 having a thickness of approximately 0.05 to 2 μm are provided on a lower surface of the light transmissive film 4 out of the set of light transmissive films 4 and 6.

The conductor patterns 5 are formed of a light transmissive conductive material such as indium tin oxide (ITO), fluorine-doped tin oxide (FTO), zinc oxide, and indium zinc oxide (IZO). The conductor pattern 5 may be obtained, for example, by forming a thin film through sputtering, electron beam deposition, or the like and patterning the thin film through laser machining, etching, or the like.

The conductor patterns 5 may be obtained, for example, by coating a mixture of fine particles of a light transmissive conductive material having an average particle diameter of 10 to 300 nm and a light transmissive resin binder in a circuit shape through screen printing or the like. Alternatively, the circuit may be formed by applying laser machining or photolithographic patterning to the coat film of the aforementioned mixture.

Without limiting to the light transmissive conductive material, the conductive patterns 5 may be obtained by adhering fine particles of an opaque conductive material such as gold, silver, and copper in a mesh shape. For example, a mesh-shaped conductor pattern 5 may be formed by coating a photosensitive compound of an opaque conductive material such as silver halide on the light transmissive film 4 and then exposing and developing it. Alternatively, the conductor pattern 5 may be formed by coating slurry containing fine particles of the opaque conductive material in a mesh shape through screen printing or the like.

Preferably, the conductor pattern 5 has light transmissive property set such that a total light transmittance of the light emitting module 1 as a whole becomes 1% or higher. When the total light transmittance of the light emitting module 1 as a whole is lower than 1%, a light-emitting point is not recognized as a bright spot. Although the light transmissive property of the conductor pattern 5 itself varies depending on its structure, it is preferable that the total light transmittance be set to 10 to 85%.

The resin layer 13 is formed between the light transmissive films 4 and 6. The resin layer 13 has transparency to visible light.

The resin layer 13 is preferably formed of a material containing elastomer as a main component. The resin layer 13 may contain other resin components or the like as necessary. As the elastomer, acrylic elastomer, olefin-based elastomer, styrene-based elastomer, ester-based elastomer, urethane-based elastomer, and the like are known in the art.

Among them, the acrylic elastomer satisfying the aforementioned properties is preferably employed as a material of the resin layer 13 because it provides excellent properties such as fluidity at the time of softening, adhesiveness after curing, and weather resistance in addition to light transmissive property, an electrical insulation property, and bendability.

The resin layer 13 is formed of light-transmitting insulating resin that satisfies predetermined properties such as a Vicat softening temperature, a tensile storage elasticity modulus, a glass transition temperature, and a melting temperature. Especially, the resin layer 13 is preferably formed of elastomer. For example, it is preferable that the Vicat softening temperature be set to 80 to 160° C., and the tensile storage elasticity modulus at a temperature of 0 to 100° C. be set to 0.01 to 10 GPa. In addition, preferably, the resin layer 13 is not molten at the Vicat softening temperature, and the tensile storage elasticity modulus at the Vicat softening temperature is set to 0.1 MPa or higher.

The melting temperature of the resin layer 13 is preferably set to be equal to or higher than 180° C., or be higher than the Vicat softening temperature by 40° C. or more. In addition, the resin layer 13 has a glass transition temperature equal to or lower than −20° C. Note that the Vicat softening temperature is a value obtained under the A50 condition described in JIS K7206 (ISO306:2004) by applying a test load of 10N at a heating rate of 50° C./hour.

The glass transition temperature and the melting temperature were measured using a method complying with JIS K7121 (ISO 3146). The glass transition temperature and the melting temperature were obtained by heating a sample at a heating rate of 5° C./min and measuring a heat amount based on heat flux differential scanning calorimetry using a differential scanning calorimeter. A tensile storage elastic modulus was measured in accordance with JIS K7244-1 (ISO 6721). The tensile storage elastic modulus is a value obtained by heating a sample from −100° C. to 200° C. at a constant heating rate of 1° C./min using an automatic dynamic viscoelastometer at a frequency of 10 Hz.

The resin layer 13 is arranged to the vicinities of the electrodes 28 and 29 of the light-emitting element 22. In a case where the areas of the electrodes 28 and 29 are smaller than the area of an upper surface of the light-emitting element 22 (including an N-type semiconductor layer and a P-type semiconductor layer), and the electrodes 28 and 29 protrude toward the conductor pattern 5, a space may be generated between the upper surface of the light-emitting element 22 and the conductor pattern 5 in some cases. The resin layer 13 is preferably formed in this space.

The thickness T2 of the resin layer 13 is smaller than the height T1 of the light-emitting element 22. As a result, a contact between the conductor pattern 5 and the electrodes 28 and 29 is improved. The light transmissive film 4 abutting on the resin layer 13 is curved inward toward the center between the neighboring light-emitting elements 22 from the portion where the light-emitting element 22 is placed. As a result, the conductor pattern 5 is pressed by the light transmissive film 4 toward the electrodes 28 and 29. Therefore, electrical connection between the conductor pattern 5 and the electrodes 28 and 29 or reliability thereof is improved.

Figure 2:
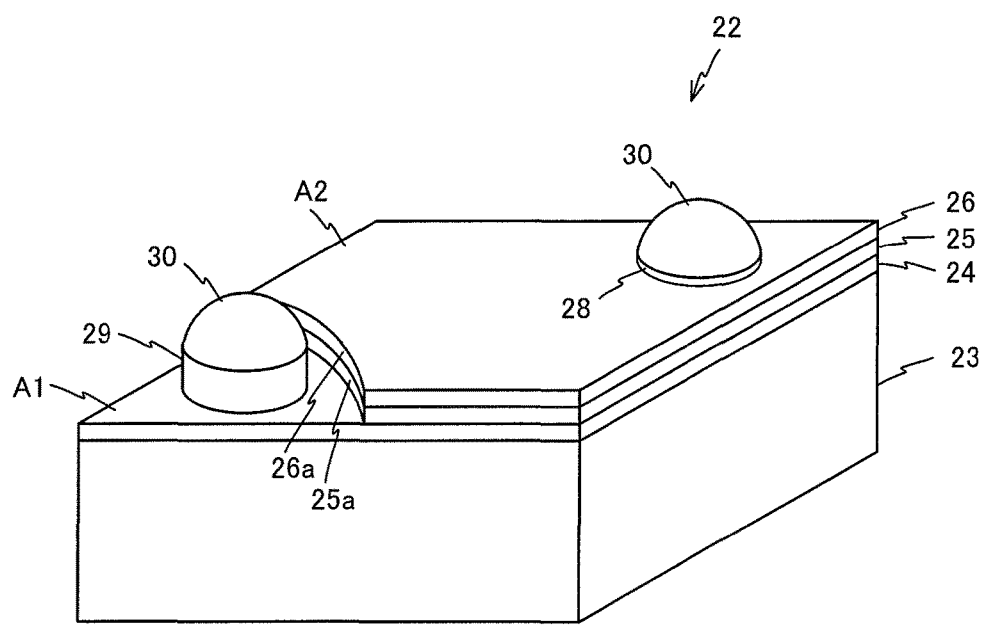
FIG. 2 is a perspective view illustrating a light-emitting element.

FIG. 2 is a perspective view illustrating the light-emitting element 22. The light-emitting element 22 is a square LED chip whose one side has a length of 0.3 to 3 mm. As illustrated in FIG. 2, the light-emitting element 22 is an LED chip including a base substrate 23, an N-type semiconductor layer 24, an active layer 25, and a P-type semiconductor layer 26. The light-emitting element 22 has a rated voltage of 2.5 V.

The base substrate 23 is a sapphire substrate or a semiconductor substrate. The N-type semiconductor layer 24 having the same shape as that of the base substrate 23 is formed on the upper surface of the base substrate 23. The N-type semiconductor layer 24 is formed of, for example, n-GaN.

The active layer 25 and the P-type semiconductor layer 26 are sequentially stacked on the upper surface of the N-type semiconductor layer 24. The active layer 25 is formed of, for example, InGaN. In addition, the P-type semiconductor layer is formed of, for example, p-GaN. The light-emitting element 22 may have a double-heterojunction (DH) structure or a multi-quantum well (MQW) structure. Note that the conduction types of the N-type semiconductor layer 24 and the P-type semiconductor layer 26 may be reversed.

Notches 25a and 26a are formed in corners of the active layer 25 and the P-type semiconductor layer 26 stacked on the N-type semiconductor layer 24, so that the surface of the N-type semiconductor layer 24 is exposed from the notches 25a and 26b. If the base substrate 23 is optically light transmissive, light is emitted from both upper and lower surfaces of the light-emitting element. Hereinafter, for convenient description purposes, the area of the surface of the N-type semiconductor layer 24 exposed from the notches 25a and 26b will be referred to as a region A1, and the area of the surface of the P-type semiconductor layer 26 will be referred to as a region A2. A height difference between the regions A1 and A2 is set to approximately 1 μm.

An electrode 29 (electrode pad) electrically connected to the N-type semiconductor layer 24 is formed in the portion of the N-type semiconductor layer 24 exposed from the active layer 25 and the P-type semiconductor layer 26. In addition, an electrode 28 (electrode pad) electrically connected to the P-type semiconductor layer 26 is formed in the corner of the P-type semiconductor layer 26. The electrodes 28 and 29 are formed of copper (Cu) or gold (Au), and a conductive bump 30 is formed on the upper surfaces of the electrodes 28 and 29. The bump 30 is a metal bump formed of metal such as gold (Au) or gold alloy. Instead of the metal bump, a solder bump may also be employed as the bump 30.

As illustrated in FIG. 1, the light-emitting elements 22 are placed at equal intervals such that a distance between the neighboring light-emitting elements 22 becomes "d." The distance "d" is set to 1,500 μm or shorter. The number of light-emitting elements 22 provided in the light-emitting module 1 may be appropriately determined depending on a specification of the light-emitting module 1 such as an exterior size or a light-emitting area.

Figure 3:
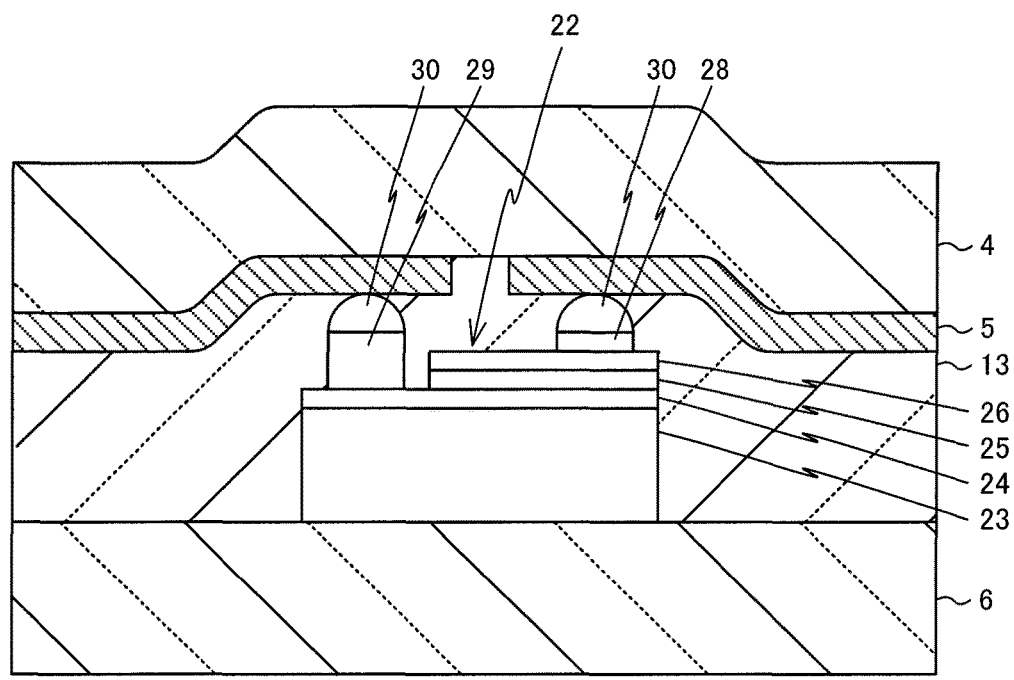
FIG. 3 is an enlarged cross-sectional view illustrating a part of the light-emitting module.

FIG. 3 is an enlarged cross-sectional view illustrating a part of the light-emitting module 1. As illustrated in FIG. 3, the electrodes 28 and 29 of the light-emitting element 22 are electrically connected to the conductor pattern 5 through the bump 30.

The bump 30 may be formed of gold, AuSn alloy, silver, copper, nickel, or an alloy, mixture, eutectic, or amorphous material with other metals. In addition, the bump 30 may be formed of solder, eutectic solder, a mixture of metal fine particles and resin, an anisotropic conductive film, or the like. The bump 30 may be a wire bump using a wire bonder, or a bump formed through electrolytic or electroless plating. Furthermore, the bump 30 may be obtained by ink-jet printing and firing ink containing fine metal particles at a high temperature. Alternatively, the bump 30 may be formed by printing or coating a paste containing fine metal particles, ball mounting, pellet mounting, vapor deposition sputtering, or the like.

The bump 30 preferably has a melting point of 180° C. or higher. More preferably, the bump 30 has a melting point of 200° C. or higher. An upper limit of the melting point of the bump 30 is practically set to 1100° C. or lower. If the melting point of the bump 30 is lower than 180° C., the bump 30 is significantly deformed in a vacuum heat pressing process of the light-emitting module manufacturing process, so that it may be difficult to maintain a sufficient thickness of the bump 30. In addition, the bump 30 may extrude from the electrode so as to degrade brightness of the LEDs disadvantageously.

The melting point of the bump 30 was measured, for example, using a differential scanning calorimeter, Model No. DSC-60, produced by Shimadzu Corporation. The melting point of the bump 30 is a value measured by heating a sample of approximately 10 mg at a heating rate of 5° C./min. When a solidus temperature and a liquidus temperature are different, the solidus temperature is set as the melting point of the bump 30.

The bump 30 has a dynamic hardness DHV equal to or higher than 3 and equal to or lower than 150. Preferably, the dynamic hardness DHV is set to be equal to or higher than 5 and equal to or lower than 100. More preferably, the dynamic hardness DHV is set to be equal to or higher than 5 and equal to or lower than 50. If the dynamic hardness DHV of the bump 30 is lower than 3, the bump 30 is significantly deformed in the vacuum heat pressing process of the light-emitting module manufacturing process, so that it is difficult to maintain a sufficient thickness of the bump 30. In addition, the bump 30 may extrude from the electrodes, so that the brightness of the LED is degraded disadvantageously. Meanwhile, if the dynamic hardness DHV of the bump 30 is higher than 150, the bump 30 deforms the light transmissive film 4 in the vacuum heat pressing process of the light-emitting module manufacturing process so as to result in poor appearance or poor connection.

The dynamic hardness DHV of the bump 30 is obtained, for example, through a test using a Shimadzu dynamic ultra micro hardness tester, Model No. DUH-W201S, produced by Shimadzu Corporation. In this test, a diamond regular pyramid indenter (Vickers indenter) having a facing angle of 136° is pushed into the bump 30 at a load speed of 0.0948 mN/sec at a temperature of 20° C. Then, a test force (P/mN) when the indentation depth (D/μm) of the indenter reaches 0.5 μm is applied to the following equation.

$$DHV=3.8584P/D^2=15.4336P$$

The bump 30 preferably has a height of 5 μm or longer and 50 μm or shorter. More preferably, the bump 30 has a height of 10 μm or longer and 30 μm or shorter. If the height of the bump 30 is shorter than 5 μm, an effect of preventing a short circuit between the conductor pattern and the P-type semiconductor layer or between the conductor pattern and the N-type semiconductor layer is degraded. Meanwhile, if the bump 30 has a height longer than 50 μm, the bump 30 deforms the light transmissive film 4 in the vacuum heat pressing process of the light-emitting module manufacturing process so as to result in poor appearance or poor connection.

A contact area between the electrode of the light-emitting element 22 and the bump 30 is preferably set to 100 μm² or larger and 15,000 μm² or smaller. More preferably, a contact area between the electrode of the light-emitting element 22 and the bump 30 is set to 400 μm² or larger and 8,000 μm² or smaller. Such dimensions are values measured under a stable environment in which a difference between the room temperature and the temperature of the measurement target object is within 20° C.±2° C.

Figure 4:
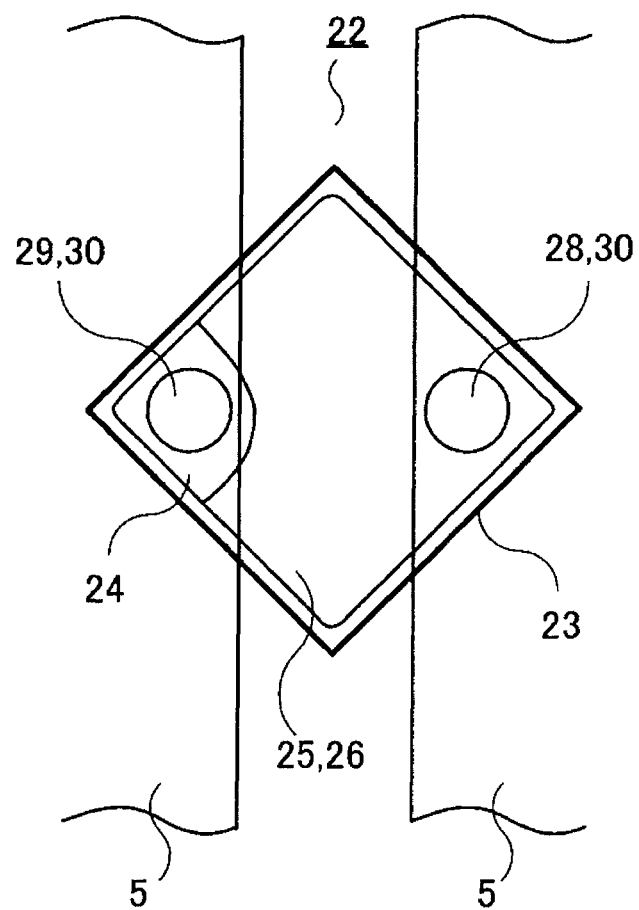
FIG. 4 is a top plan view illustrating a connection example of the light-emitting element.

FIG. 4 illustrates a connection example between the conductor pattern 5 and the light-emitting element 22. Each of the electrodes 28 and 29 of the light-emitting element 22 is connected to each of the neighboring conductor patterns 5.

The set of light transmissive films 4 and 6, the resin layer 13, and the plurality of light-emitting elements 22 are integrated through vacuum heat pressing. For this reason, at least a part of the bump 30 is electrically connected to the electrodes 28 and 29 of the light-emitting element 22 while it is not molten. Therefore, a contact angle between the upper surface of the electrode 28 and 29 and the bump 30 becomes, for example, 135° or smaller.

The light-emitting element 22 is turned on or off by a DC voltage applied through the electrodes 28 and 29. For example, assuming that the light-emitting module 1 has seven light-emitting elements 22 arranged in two rows, the conductor pattern 5 of the light-emitting module 1 forms a 7-series and 2-parallel circuit. In the light-emitting elements 22 connected in series, the flowing current has the same magnitude in overall light-emitting elements 22.

The light-emitting element 22 of the light-emitting module 1 configured as described above has the bump 30. For this reason, even when the flexible light-emitting module 1 obtained by burying the light-emitting elements 22 is bent such that the electrodes 28 and 29 side become convex, a sufficient height (vertical distance) is secured between the upper surface of the light-emitting element 22 and the conductor pattern 5 by virtue of the bump 30. Therefore, it is possible to prevent a short circuit in the light-emitting module 1.

That is, as illustrated in FIG. 4, the conductor pattern 5 connected to the electrode 29 in the N-type semiconductor layer 24 side is placed over the P-type semiconductor layer 26. Therefore, when the light-emitting module 1 is bent such that the electrode 28, 29 sides become convex, a short circuit occurs because the conductor pattern 5 of the N-type semiconductor layer 24 side and the P-type semiconductor layer 26 overlap each other. However, by securing a sufficient height between the upper surface of the light-emitting element 22 and the conductor pattern 5 by virtue of the bump 30, it is possible to avoid a short circuit.

Figure 5A:
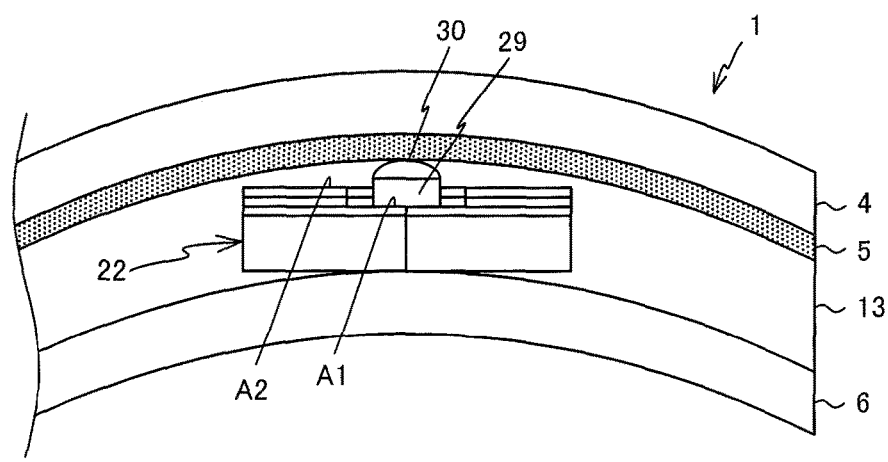
FIG. 5A is a diagram illustrating the light-emitting module in a curved state.

For example, FIG. 5A is a diagram illustrating a state in which the light-emitting module 1 according to this embodiment is curved. In addition, FIG. 5B is a diagram illustrating a state in which the light-emitting module 300 in a comparative example is curved.

When the bump 30 is formed on the electrodes 28 and 29 of the light-emitting element 22 as illustrated in FIG. 5A, a vertical distance from the conductor pattern 5 of the region A1 side to the region A2 of the light-emitting element 22 increases. Therefore, even when the light-emitting module 1 is curved, a contact between the conductor pattern 5 connected to the electrode 29 of the region A1 side and the surface of the region A2 of the light-emitting element 22 is suppressed.

Figure 5B:
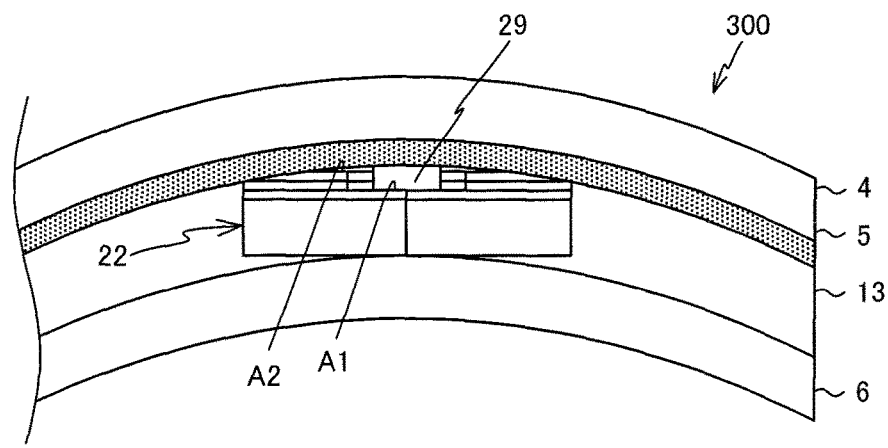
FIG. 5B is a diagram illustrating a light-emitting module of the prior art in a curved state.

Meanwhile, in a case where the bump 30 is not formed in the electrodes 28 and 29 of the light-emitting element 22 as illustrated in FIG. 5B, the conductor pattern 5 connected to the electrode 29 of the region A1 side and the surface of the region A2 of the light-emitting element 22 make contact with each other as the light-emitting module 300 is curved, so that a leakage path is generated through the N-type semiconductor layer 24, the electrode 29, the conductor pattern 5, and the P-type semiconductor layer 26, and this results in a short circuit.

As described above, in the light-emitting module 1 according to this embodiment, a sufficient vertical distance is secured between the conductor pattern 5 and the light-emitting element 22 by virtue of the bump 30. Therefore, it is possible to prevent a short circuit in the circuit.

<Manufacturing Method>

Next, a manufacturing method of the light-emitting module 1 according to an embodiment will be described.

First, a light-emitting element 22 provided with electrodes 28 and 29 (anode/cathode or cathode/anode) is prepared.

Then, bumps 30 are formed in both the electrodes 28 and 29 of the light-emitting element 22. As a method of forming the bumps 30, a technique of forming a gold bump or a gold-alloy bump from an Au wire or an Au-alloy wire using a wire bump machine may be employed. The employed wire preferably has a diameter of 15 μm or larger and 75 μm or smaller.

According to this embodiment, a wire bonding machine is employed. After forming a ball by melting the wire through discharging at a tip of the wire, the ball and the electrodes 28 and 29 are connected using ultrasonic waves. Then, while the ball is connected to the electrodes 28 and 29, the wire is cut out from the ball. As a result, as illustrated in FIG. 6, the bump 30 is formed on the upper surface of the electrodes 28 and 29 while a protrusion remains in the top end.

<Rounding Treatment>

A small protrusion in the top end of the bump 20 may remain as it is. Alternatively, rounding treatment of the bump 30 may be performed by pressing the upper surface of the bump 20 as desired.

Figure 6:
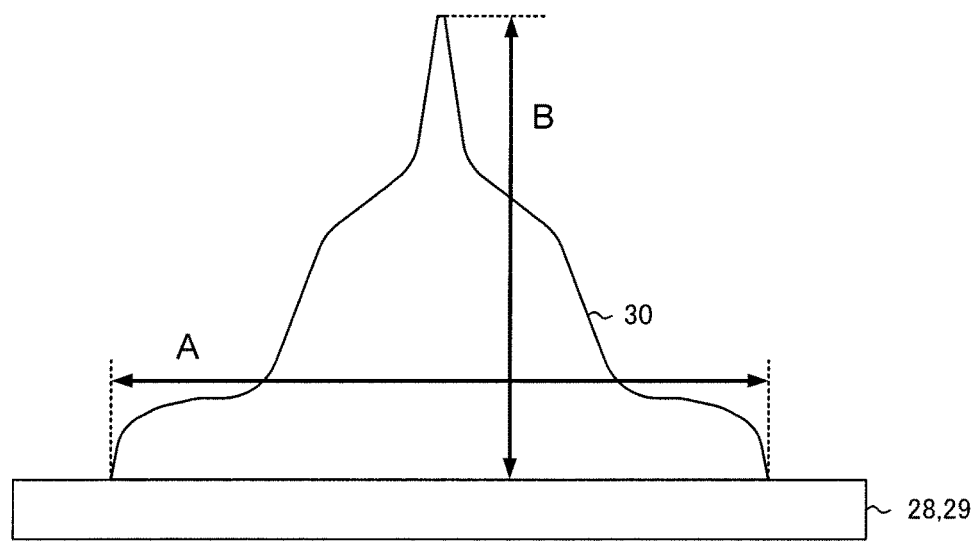
FIG. 6 is a diagram illustrating a bump.

By way of example, as illustrated in FIG. 6, a protrusion generated when the wire is cut remains in the upper portion of the bump 30. This protrusion is referred to as a tail. The bump 30 is preferably shaped such that a ratio "B/A" becomes 0.2 to 0.7, assuming that "A" denotes a diameter of the surface making contact with the electrodes 28 and 29, and "B" denotes a height of the bump 30. Here, the rounding treatment is performed when the shape of the bump 30 deviates from the corresponding numerical range.

Figure 7A:
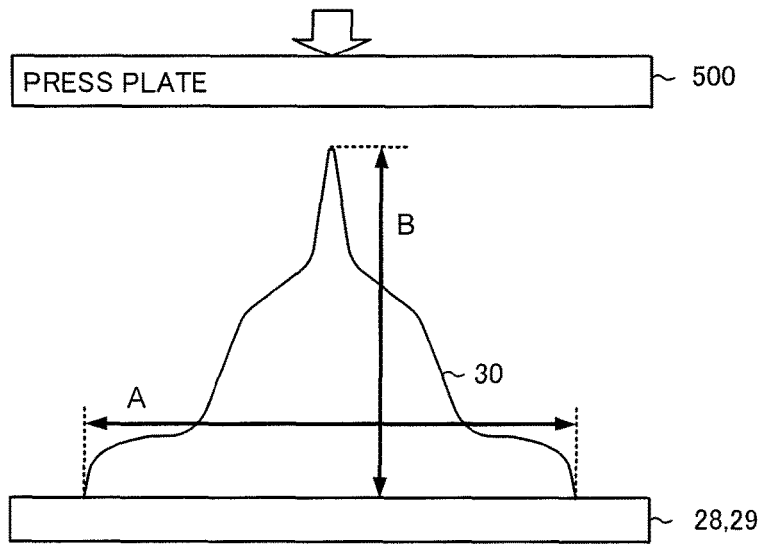
FIG. 7A is a diagram for describing bump rounding treatment.
Figure 7B:
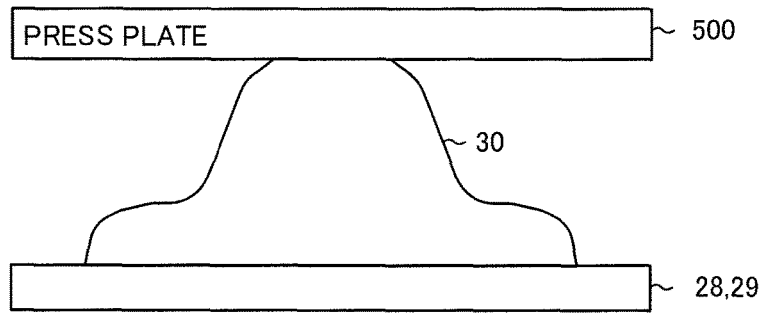
FIG. 7B is a diagram for describing bump rounding treatment.
Figure 7C:
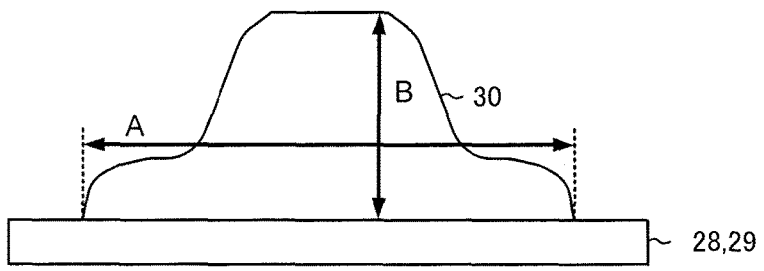
FIG. 7C is a diagram for describing bump rounding treatment.

FIGS. 7A to 7C are diagrams for describing rounding treatment using a press plate 500. After forming the bump 30, the light-emitting element 22 is placed in a bump bonding machine (not shown). In addition, as illustrated in FIG. 7A, a press plate 500 provided in the bump bonding machine is positioned over the bump 30 while its lower surface is in parallel with the electrodes 28 and 29.

Then, the press plate 500 is lowered to press the upper portion of the bump 30 as illustrated in FIG. 7B. In this case, the press plate 500 is lowered until the height of the bump has a desired height B. The tail of the bump 30 is pressed by the press plate 500. As a result, as illustrated in FIG. 7C, a continuous surface having no protrusion is formed on the bump 30. This continuous surface becomes flat at the top end of the bump 30.

The rounding treatment may be performed by pressing the bump 30 by inserting a resin sheet. In this case, a resin sheet 501 formed of, for example, PET, fluororesin, TPX, olefin, or the like is installed on a lower surface of the press plate 500. In addition, as illustrated in FIG. 8A, the press plate 500 provided with the resin sheet 501 is positioned over the bump 30 while its lower surface is in parallel with the electrodes 28 and 29.

Then, the press plate 500 is lowered to allow the resin sheet 501 to press the upper portion of the bump 30 as illustrated in FIG. 8B. The press plate 500 is lowered until the height of the bump becomes a desired height B. The tail of the bump 30 is pressed by the resin sheet 501. As a result, as illustrated in FIG. 8C, a continuous surface having no protrusion is formed in the upper portion of the bump 30. The continuous surface formed in the bump 30 through the rounding treatment using the resin sheet 501 becomes a convex curved surface even in the top end of the bump 30.

Figure 9A:
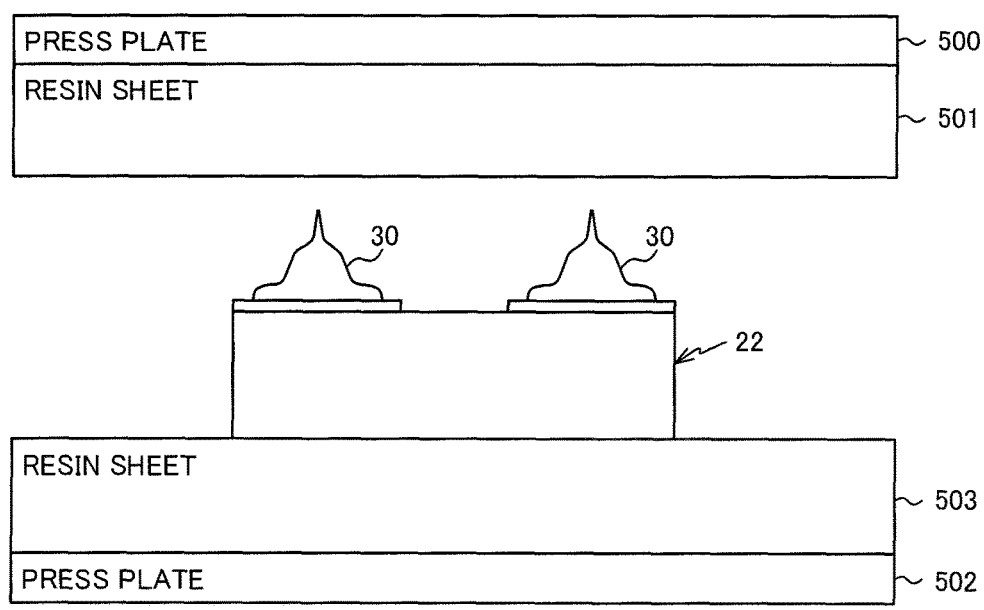
FIG. 9A is a diagram for describing bump rounding treatment.

In the rounding treatment using the resin sheet 501, for example, the press plate 500 provided with the resin sheet 501 is placed over the light-emitting element 22, and the press plate 502 provided with the resin sheet 503 is placed under the light-emitting element 22 as illustrated in FIG. 9A. Such resin sheets 501 and 503 have a thickness larger than a sum of the thickness of the light-emitting element 22 and the height B of the bump 30.

Figure 9B:
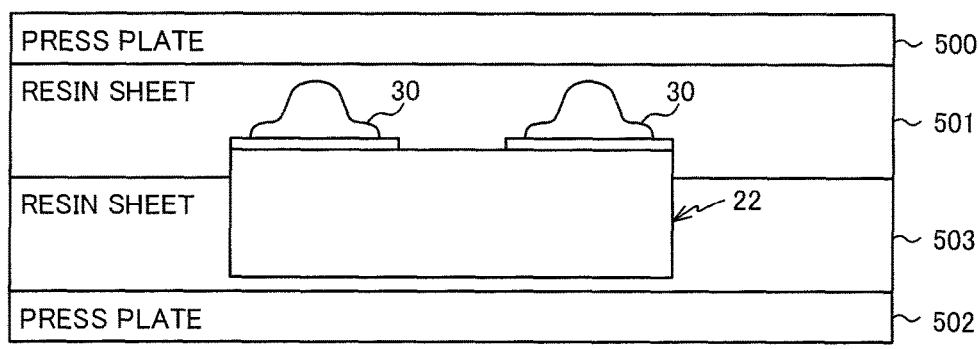
FIG. 9B is a diagram for describing bump rounding treatment.

The pressing is performed by lowering the press plate 500 and lifting the press plate 502 at the same time to interpose the light-emitting element 22. As a result, the light-emitting element 22 is buried inside the resin sheets 501 and 503 as illustrated in FIG. 9B. In this case, the bump 30 of the light-emitting element 22 is subjected to the rounding treatment so that the tail is pressed. The movement amounts of the press plates 500 and 502 during the pressing are determined depending on a target height of the bump 30.

Then, the pressing of the light-emitting element 22 is terminated, and the resin sheets 501 and 503 are removed from the light-emitting element 22. As a result, it is possible to obtain the light-emitting element 22 having the bump 30 provided with a continuous surface having a continuous curved face.

The bump 30 is formed on the upper surface of the light-emitting element 22 as described above. Without limiting thereto, the bump 30 may be a bump formed through electrolytic plating or electroless plating instead of the wire bump. The bump 30 may be formed through inkjet coating using ink containing metal fine particles, applying or printing a paste containing metal fine particles, ball mounting, pellet mounting, thermocompression bonding of an anisotropic conductive film, or the like. The bump 30 may be formed of metal such as gold, silver, copper, and nickel, alloy such as gold-tin alloy, eutectic or amorphous solder, or the like.

Figure 10A:
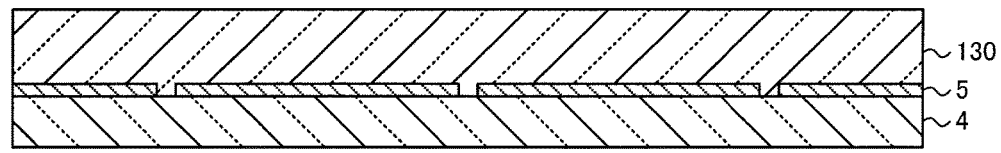
FIG. 10A is a diagram for describing a method of manufacturing a light-emitting module.

As the bump 30 is formed in the light-emitting element 22, a light transmissive film 4 provided with the conductor pattern 5 is prepared on the upper surface. In addition, as illustrated in FIG. 10A, a resin sheet 130 having light transmissive property is placed on the upper surface of the light transmissive film 4.

This resin sheet 130 is formed in substantially the same shape as that of the light transmissive film 4. The resin sheet 130 has a Vicat softening temperature of 80 to 160° C. and a tensile storage elasticity modulus of 0.01 to 10 GPa at a temperature of 0 to 100° C. In addition, the resin sheet 130 is not molten at the Vicat softening temperature, and the tensile storage elasticity modulus at the Vicat softening temperature is equal to or higher than 0.1 MPa. The melting temperature of the resin sheet 130 is set to be equal to or higher than 180° C., or be higher than the Vicat softening temperature by 40° C. or more. In addition, the glass transition temperature of the resin sheet 120 is equal to or lower than −20° C. As the resin sheet 130 satisfying the aforementioned condition, an elastomer sheet such as a thermoplastic acrylic elastomer sheet may be employed.

The resin sheet 130 is slightly thinner than the light-emitting element 22 including the bump.

Figure 10B:
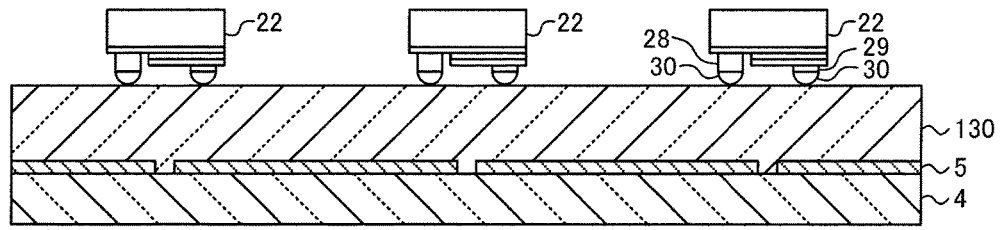
FIG. 10B is a diagram for describing a method of manufacturing the light-emitting module.

Then, the light-emitting element 22 is placed on the upper surface of the resin sheet 130 as illustrated in FIG. 10B. The light-emitting element 22 is placed such that a surface having the electrodes 28 and 29 faces the light transmissive film 4. In addition, the light-emitting element 22 is positioned such that the electrodes 28 and 29 are placed over the corresponding conductor patterns 5.

Figure 10C:
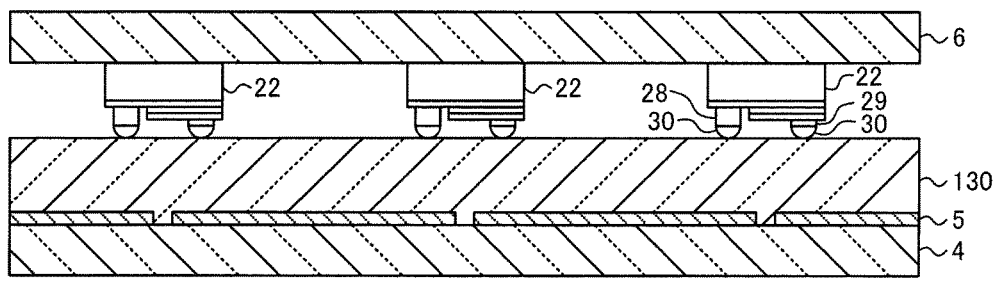
FIG. 10C is a diagram for describing a method of manufacturing the light-emitting module.

Then, the light transmissive film 6 is placed over the light-emitting element 22 as illustrated in FIG. 10C.

Then, a layered product including the light transmissive films 4 and 6, the resin sheet 130, and the light-emitting element 22 is pressed while being heated under a vacuum atmosphere.

In the layered product heating/pressing process under a vacuum atmosphere (vacuum thermocompression bonding process), the layered product is preferably pressed and heated to a temperature range T with respect to the Vicat softening temperature Mp (° C.) of the resin sheet 130, where "Mp−10(° C.)≤T≤Mp+30(° C.)." In addition, the layered product is more preferably heated to a temperature range T, where "Mp−10(° C.)≤T≤Mp+10(° C.)."

By applying such a heating condition, it is possible to press the layered product while appropriately softening the resin sheet 130. In addition, the resin layer 13 may be formed, by inserting the resin sheet 130, such that a softened resin sheet 130 may be filled between the light transmissive films 4 and 5 while the electrodes 28 and 29 of the light-emitting element 22 placed on the conductor pattern 5 are connected to predetermined positions of the conductor pattern 5.

If the heating temperature T during the vacuum thermocompression bonding of the layered product is lower than a temperature obtained by subtracting 10° C. from the Vicat softening temperature Mp of the resin sheet 130 (T<Mp-10), softening of the resin sheet 130 becomes insufficient. In this case, adherence of the resin sheet 130 (further, the resin layer 13) to the light-emitting element 22 may be degraded. If the heating temperature T is higher than a temperature obtained by adding 30° C. to the Vicat softening temperature Mp of the resin sheet 130 (Mp+30<T), the resin sheet 130 may be excessively softened so as to result in an unsatisfactory shape.

<Thermocompression Bonding Process>

Figure 10D:
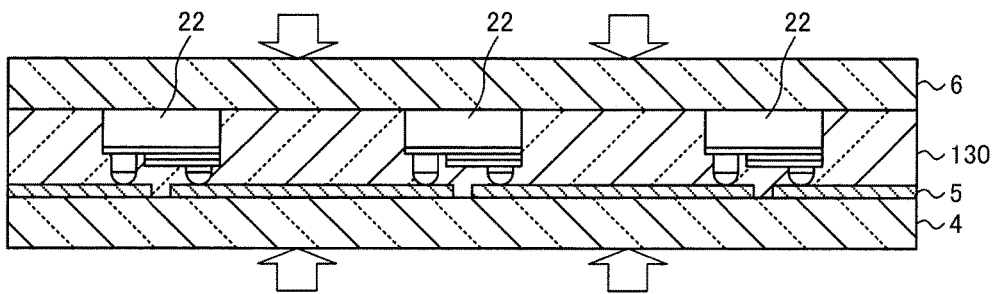
FIG. 10D is a diagram for describing a method of manufacturing the light-emitting module.

The thermocompression bonding process for the layered product under a vacuum atmosphere is preferably performed in the following way. The aforementioned layered product is preliminarily pressed to allow each component to abut on each other. Then, a work space where the preliminarily pressed layered product is placed is evacuated in vacuum, and the layered product is pressed while being heated to the aforementioned temperature. If the thermocompression bonding is performed for the preliminarily pressed layered product under a vacuum atmosphere in this manner, it is possible to fill the softened resin sheet 130 into a space between the light transmissive films 4 and the 6 as illustrated in FIG. 10D.

The vacuum atmosphere for the thermocompression bonding is preferably set to 5 kPa or lower. The preliminary pressing process may also be omitted. However, in this case, a positional deviation or the like may easily occur in the layered product. Therefore, it is preferable to perform the preliminary pressing process.

If the thermocompression bonding process of the layered product is performed under an atmospheric environment or low vacuum, bubbles easily remain in the light-emitting module 1 after the thermocompression bonding, especially, around the light-emitting element 22. The air inside the bubbles remaining in the light-emitting module 1 is pressurized. For this reason, the light-emitting module 1 subjected to the thermocompression bonding may be blistered, or the light-emitting element 22 and the light transmissive films 4 and 6 may be exfoliated. In addition, if bubbles or blisters are present inside the light-emitting module 1, especially, in the vicinity of the light-emitting element 22, light is irregularly scattered, so that appearance of the light-emitting module 1 becomes unsatisfactory.

In this manner, by performing a vacuum thermocompression bonding process while the resin sheet 130 is interposed between the conductor pattern 5 and the electrodes 28 and 29 of the light-emitting element 22, it is possible to form the resin layer 13 around the light-emitting element 22 while electrically connecting the electrodes 28 and 29 and the conductor pattern 5. In addition, for example, it is possible to appropriately fill a part of the resin layer 13 in the space between the upper surface of the light-emitting element 22 and the conductor pattern 5 as illustrated in FIG. 3.

By performing the thermocompression bonding process for the layered product, the light-emitting module 1 of FIG. 1 is completed. In the manufacturing method according to this embodiment, it is possible to manufacture the light-emitting module 1 having excellent electrical connectability between the conductor pattern 5 and the electrodes 28 and 29 of the light-emitting element 22 or reliability thereof with high reproducibility.

Note that the heights of the electrodes 28 and 29 may be different from each other or may be the same. In addition, although the light-emitting element 22 is assembled to face downward in FIGS. 10A to 10D, the manufacturing process may advance while the light-emitting element 22 faces upward.

Figure 11A:
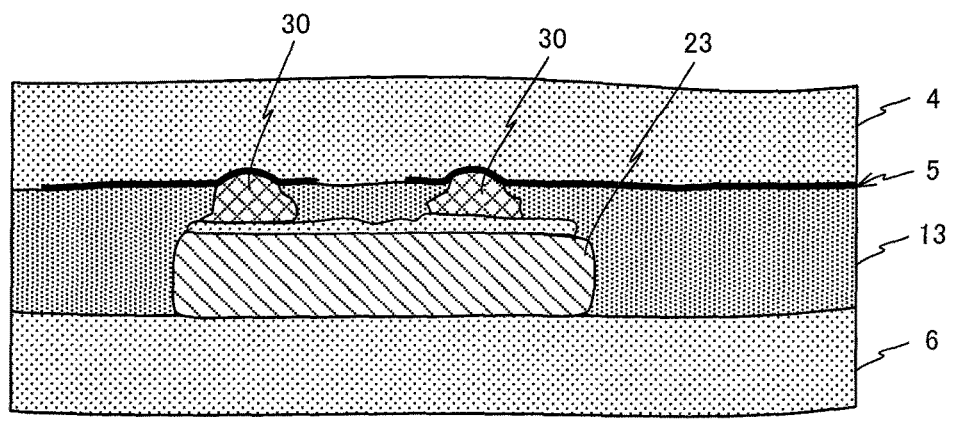
FIG. 11A is a diagram illustrating a light-emitting element, and a light transmissive film and a conductor pattern placed in the vicinity of the light-emitting element.
Figure 11B:
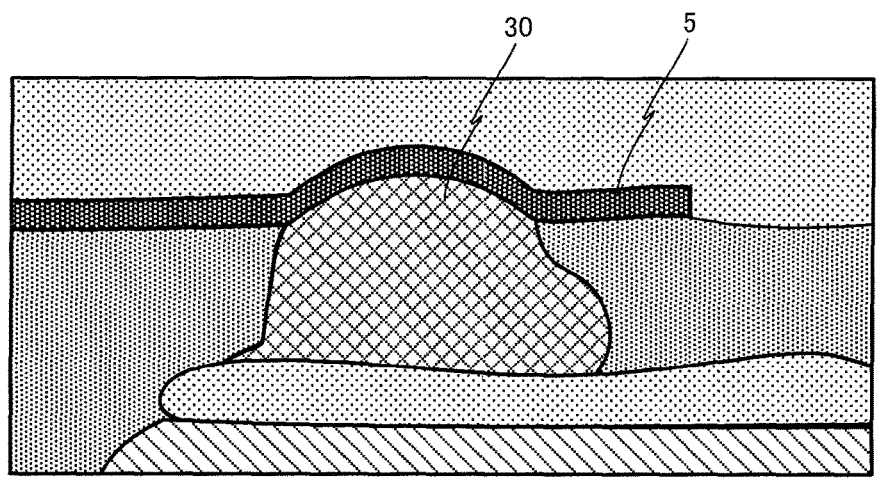
FIG. 11B is an enlarged view illustrating the bump formed on an electrode of the light-emitting element.

FIG. 11A is a diagram illustrating the light emitting element 22, the resin layer 13, the conductor pattern 5, and the light transmissive films 4 and 6 placed around the light emitting element 22 included in the light emitting module 1. In addition, FIG. 11B is an enlarged view illustrating the bump 30 formed in the electrodes 28 and 29 of the light-emitting element 22. As recognized from FIGS. 11A and 11B, in the light-emitting module 1, a contact region of the conductor pattern 5 making contact with the bump 30 of the light-emitting element 22 is recessed along the bump 30. As a result, a contact area between the bump 30 and the conductor pattern 5 increases. This makes it possible to reduce a resistance between the bump 30 and the conductor pattern 5.

In this embodiment, the resin layer 13 includes a single-layered resin sheet 130. Alternatively, the resin layer 13 may include a pair of resin sheets 130. In this case, by pressing the layered product while the light-emitting element 22 is interposed between the pair of resin sheets 130, it is possible to obtain the light-emitting module 1 of FIG. 1.

In a case where the resin layer 13 includes a pair of resin sheets 130, the light transmissive film 6 is used as a provisional substrate to obtain electrical connection between the electrodes 28 and 29 and the conductor pattern 5 by pressing the entire light transmissive film 6. Then, one of the pair of resin sheets 130 opposite to the electrodes 28 and 29 is exfoliated. In addition, a resin sheet 130 having the same thickness as that exfoliated and a final light transmissive film 6 may be coated again to obtain the light-emitting module 1 of FIG. 1.

Second Embodiment

Next, a light-emitting module according to a second embodiment of the disclosure will be described with reference to the accompanying drawings. Note that like reference numerals denote like elements as in the light-emitting module of the first embodiment, and they will not be described repeatedly.

Figure 12:
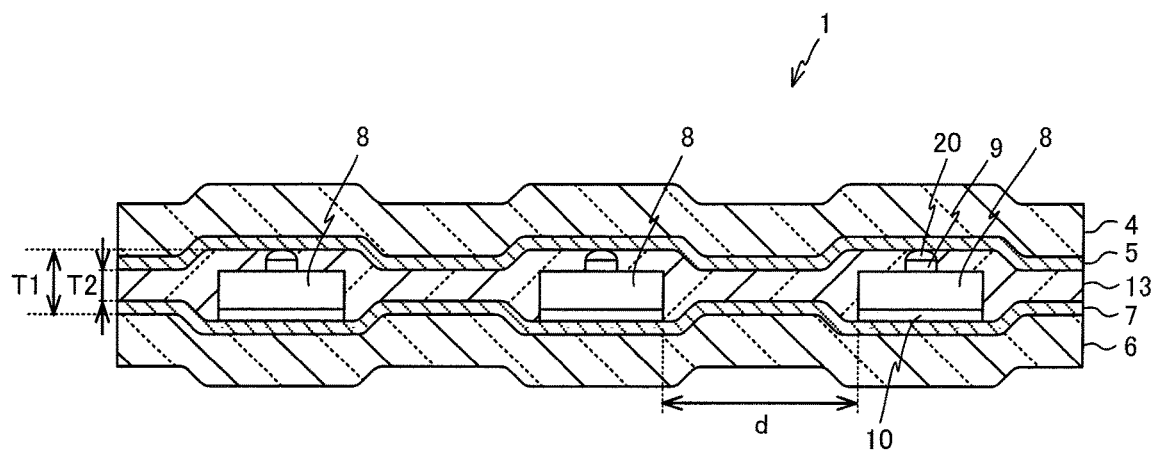
FIG. 12 is a cross-sectional view illustrating a light-emitting module according to the first embodiment.

FIG. 12 is a cross-sectional view illustrating a schematic configuration of the light-emitting module 1 according to this embodiment. The light-emitting module according to the second embodiment is different from the light-emitting module of the first embodiment in that a light-emitting element of the light-emitting module 1 has electrodes on both surfaces.

As illustrated in FIG. 12, the light-emitting module 1 has a set of light transmissive films 4 and 6, a resin layer 13 formed between the light transmissive films 4 and 6, and a plurality of light-emitting elements 8 arranged inside the resin layer 13.

The light transmissive films 4 and 6 are arranged to face each other. Similar to the light transmissive film 4, a conductor pattern 7 is formed on the upper surface (the surface facing the light transmissive film 4) of the light transmissive film 6.

A plurality of light-emitting elements 8 are arranged between the light transmissive films 4 and 6. The light-emitting element 8 has an electrode 9 (electrode pad) provided on the surface facing the light transmissive film 4 and an electrode 10 provided on the surface facing the light transmissive film 6.

A light-emitting diode chip (LED chip) having a p-n junction may be employed as the light-emitting element 8. The light-emitting element 8 is not limited to the LED chip, and may include a laser diode (LD) chip or the like.

The light-emitting element 8 may be obtained by forming a P-type semiconductor layer on an N-type semiconductor substrate, by forming an N-type semiconductor layer on a P-type semiconductor substrate, or by forming an N-type semiconductor layer and a P-type semiconductor layer on a semiconductor substrate. Alternatively, an LED may be bonded to a metal support substrate such as CuW or a semiconductor support substrate such as Si, Ge, or GaAs so that the p-n junction is shifted from an initial semiconductor substrate to the support substrate. In addition, the light-emitting element 8 may have a double-heterojunction (DH) structure or a multi-quantum well (MQW) structure.

Figure 13:
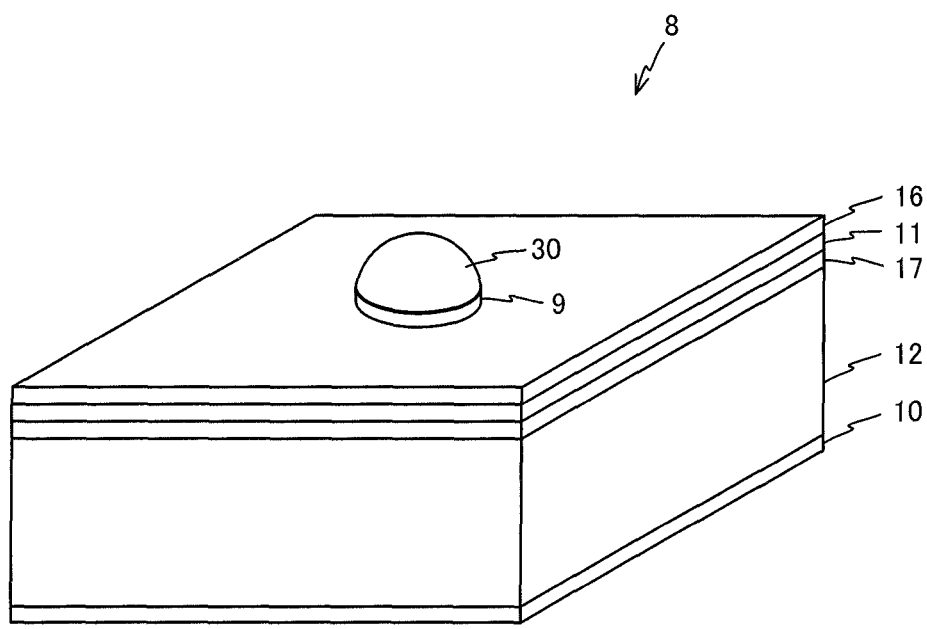
FIG. 13 is a perspective view illustrating a light-emitting element.

FIG. 13 is a perspective view illustrating the light-emitting element 8. The light-emitting element 8 is a square LED chip whose one side has a length of 0.3 to 3 mm. As illustrated in FIG. 13, the light-emitting element 8 has a base material 12, a P-type semiconductor layer 16 stacked on the upper surface of the base material 12, a light-emitting layer 11 (a PN junction interface or a light-emitting portion of a double heterojunction structure), and an N-type semiconductor layer 17. In addition, an electrode 9 (electrode pad) is provided on the upper surface of the P-type semiconductor layer 16, and an electrode 10 is provided on the lower surface of the base material 12. Note that the positions of the P-type semiconductor layer 16 and the N-type semiconductor layer 17 may be reversed.

Figure 14:
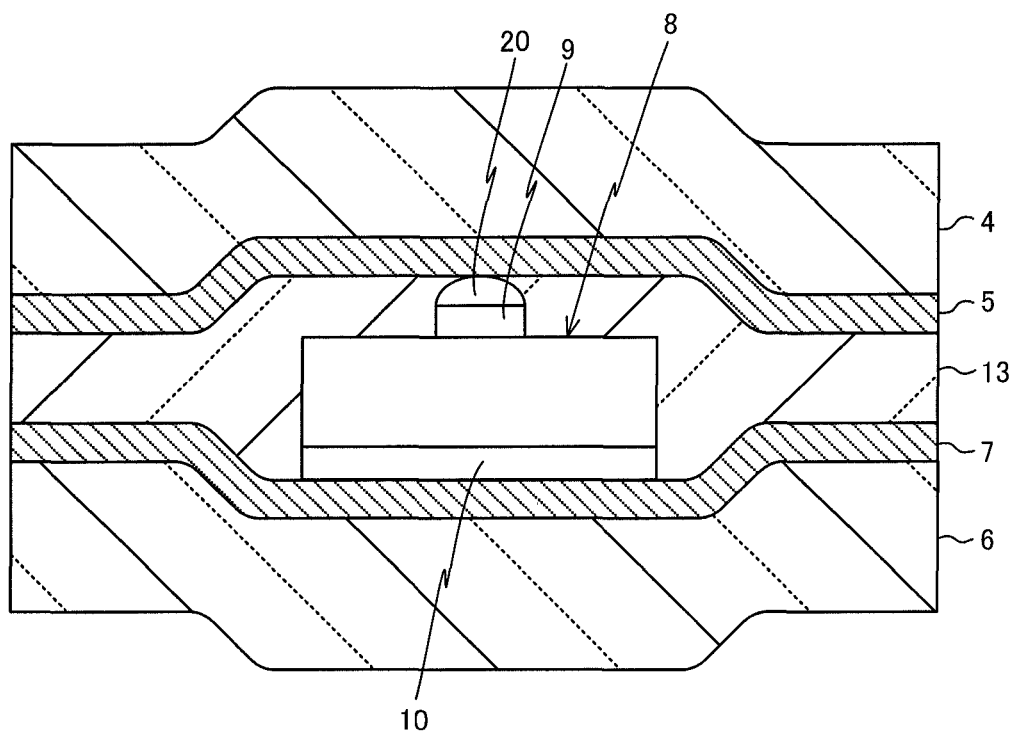
FIG. 14 is an enlarged cross-sectional view illustrating a part of the light-emitting module.

FIG. 14 is an enlarged cross-sectional view illustrating a part of the light-emitting module 1. As illustrated in FIG. 14, the electrode 9 is electrically connected to the conductor pattern 5 through the bump 20. The electrode 10 is directly connected to the conductor pattern 7.

The light-emitting element 8 is turned on by a DC voltage applied through the electrodes 9 and 10. In addition, the light-emitting element 8 may have a light reflection layer, a current diffusion layer, a light transmissive electrode, or the like.

The bump 20 has the same structure as that of the bump 30 of the first embodiment. The bump 20 preferably has a height of 5 μm or longer and 50 μm or shorter. More preferably, the bump 20 has a height of 10 μm or longer and 30 μm or shorter. If the height of the bump 20 is shorter than 5 μm, an effect of preventing a short circuit between the conductor pattern 5 and the P-type semiconductor layer 16 is degraded. Meanwhile, if the bump 20 has a height longer than 50 μm, the bump 20 deforms the light transmissive film 4 in the vacuum heat pressing process of the light-emitting module manufacturing process so as to result in poor appearance or poor connection.

A contact area between the electrode 9 of the LED chip and the bump 20 is preferably set to 100 μm² or larger and 15,000 μm² or smaller. More preferably, a contact area between the electrode 9 of the LED chip and the bump 20 is set to 400 μm² or larger and 8,000 μm² or smaller. The aforementioned contact areas are values measured under a stable environment in which a difference between the room temperature and the temperature of the measurement target object is within 20° C.±2° C.

Preferably, the resin layer 13 is not molten at the Vicat softening temperature, and the tensile storage elasticity modulus at the Vicat softening temperature is set to 0.1 MPa or higher. The melting temperature of the resin layer 13 is preferably set to be equal to or higher than 180° C., or be higher than the Vicat softening temperature by 40° C. or more. In addition, the resin layer 13 has a glass transition temperature equal to or lower than −20° C.

The elastomer as a material of the resin layer 13 preferably has a peeling strength (in accordance with a method A of JIS C5061 8.1.6) of 0.49 N/mm or stronger for the conductor patterns 5 and 7 of the resin layer 13 formed of the elastomer.

Using the elastomer or the like satisfying the conditions regarding the Vicat softening temperature, the tensile storage elasticity modulus, and the melting temperature, it is possible to bury the resin layer 13 between the light transmissive film 4 and the light transmissive film 6 while the resin layer 13 abuts on a plurality of light-emitting elements 8. In other words, a contact state between the conductor pattern 5 and the electrode 9 and a contact state between the conductor pattern 7 and the electrode 10 are maintained by the resin layer 13 placed around the light-emitting elements 8 in an abutting state.

For this reason, in a case where a bending test or a thermal cycling test (TCT) is performed for the light-emitting module 1, it is proved that the electrical connection reliability between the conductor pattern 5 and the electrode 9, and between the conductor pattern 7 and the electrode 10 is excellent.

If the Vicat softening temperature of the resin layer 13 exceeds 160° C., it is possible to sufficiently deform the resin sheet in a process of forming the resin layer 13 described below. For this reason, electric connection reliability is degraded between the conductor pattern 5 and the electrode 9 and between the conductor pattern 7 and the electrode 10. If the Vicat softening temperature of the resin layer 13 is lower than 80° C., a holding force of the light-emitting element 8 is short, so that electric connection reliability is degraded between the conductor pattern 5 and the electrode 9 and between the conductor pattern 7 and the electrode 10. The Vicat softening temperature of the resin layer 13 is preferably set to 100° C. or higher. In this case, it is possible to further improve electrical connection reliability between the conductor pattern 5 and the electrode 9 and between the conductor pattern 7 and the electrode 10. The Vicat softening temperature of the resin layer 13 is preferably set to 140° C. or lower. As a result, it is possible to more effectively improve electrical connectability between the conductor pattern 5 and the electrode 9 and between the conductor pattern 7 and the electrode 10.

Even when the tensile storage elasticity modulus of the resin layer 13 at a temperature of 0° C. to 100° C. is lower than 0.01 GPa, the electrical connectability is degraded between the conductor pattern 5 and the electrode 9 and between the conductor pattern 7 and the electrode 10.

The light-emitting elements 8 and their electrodes 9 and 10 are very small. For this reason, in order to accurately connect the electrodes 9 and 10 of the light-emitting element 8 to predetermined positions of the conductor patterns 5 and 7 during the vacuum thermocompression bonding described below, it is necessary for the resin sheet 130 to maintain a relatively high storage elasticity modulus until the temperature reaches the vicinity of the heating temperature of the vacuum thermocompression bonding process from the room temperature.

If the elasticity of the resin is reduced during the vacuum thermocompression bonding, the light-emitting element 8 is easily tilted or slightly shifted in a horizontal direction in the course of processing, so that the electrodes 9 and 10 and the conductor patterns 5 and 7 may be electrically disconnected, or a connection resistance may increase disadvantageously. The tilting or horizontal shifting of the light-emitting element 8 degrades a manufacturing yield or reliability of the light-emitting module 1. In order to prevent the tilting or horizontal shifting of the light-emitting element 8, a resin layer 13 having a tensile storage elasticity modulus equal to or higher than 0.01 GPa at a temperature of 0° C. to 100° C. is employed.

If the tensile storage elasticity modulus of the resin layer 13 is excessively high, the bending resistance of the light-emitting module 1 is degraded. For this reason, the resin layer 13 having a tensile storage elasticity modulus equal to or lower than 10 GPa at a temperature of 0° C. to 100° C. is employed. The tensile storage elasticity modulus of the resin layer 13 at a temperature of 0° C. to 100° C. is preferably equal to or higher than 0.1 GPa and equal to or lower than 7 GPa.

If the elastomer or the like of the resin layer 13 is not molten at the Vicat softening temperature, and the tensile storage elasticity modulus at the Vicat softening temperature is equal to or higher than 0.1 MPa, it is possible to further improve the positioning accuracy between the electrodes 9 and 10 and the conductor patterns 5 and 7 during the vacuum thermocompression bonding.

In this regard, the melting temperature of the elastomer of the resin layer 13 is preferably set to be equal to or higher than 180° C., or be higher than the Vicat softening temperature by 40° C. or more. More preferably, the tensile storage elasticity modulus of the elastomer at the Vicat softening temperature is set to be equal to or higher than 1 MPa. In addition, the melting temperature of the elastomer is preferably set to be equal to or higher than 200° C. or be higher than the Vicat softening temperature by 60° C. or more.

In order to improve a bending resistance or a heat cycle resistance of the light-emitting module 1 across a wide temperature range from a low temperature to a high temperature as well as manufacturability of the light-emitting module 1, it is important to balance the Vicat softening temperature, the tensile storage elasticity modulus, and the glass transition temperature described above. By employing the elastomer having the tensile storage elasticity modulus described above as the resin layer 13, it is possible to improve the bending resistance or the heat cycle resistance of the light-emitting module 1.

The light emitting module is required to have a bending resistance and a heat cycle resistance under a low-temperature environment depending on the living environment in the winter season regardless of outdoor use or indoor use. The bending resistance or the heat cycle resistance of the light-emitting module 1 under a low temperature environment may be degraded if the glass transition temperature of the elastomer is excessively high. For this reason, elastomer having a glass transition temperature of −20° C. or lower is preferably employed as the resin layer 13. By employing the elastomer having a suitable glass transition temperature and a suitable tensile storage elasticity modulus as the resin layer 13, it is possible to improve the bending resistance and the heat cycle resistance of the light-emitting module 1 across a wide temperature range from a low temperature to a high temperature. The glass transition temperature of the elastomer is more preferably set to −40° C. or lower.

The thickness of the resin layer 13 may be equal to a gap between the light transmissive films 4 and 6 based on the height of the light-emitting element 8. However, in order to improve contactability between the conductor patterns 5 and 7 and the electrodes 9 and 10, the thickness of the resin layer 13 is preferably smaller than the height of the light-emitting element 8 including the bump. In addition, the thickness T2 of the resin layer 13 is more preferably set such that a difference T1-T2 between the thickness T2 and the height T1 of the light-emitting element 8 including the bump has a range of 5 to 200 µm.

If the thickness T2 of the resin layer 13 is excessively small, it is difficult to maintain a shape of the resin layer 13. In addition, adherence to the light-emitting element 8 may be degraded. For this reason, the difference T1-T2 between the height T1 of the light-emitting element 8 and the thickness T2 of the resin layer 13 is preferably set to be equal to or smaller than a half of the height T1 of the light-emitting element 8.

The light-emitting element 8 of the light-emitting module 1 configured as described above has the bump 20. For this reason, a vertical distance between the conductor pattern 5 and the light-emitting element 8 is secured, so that it is possible to prevent a short circuit in the light-emitting module 1.

Figure 15A:
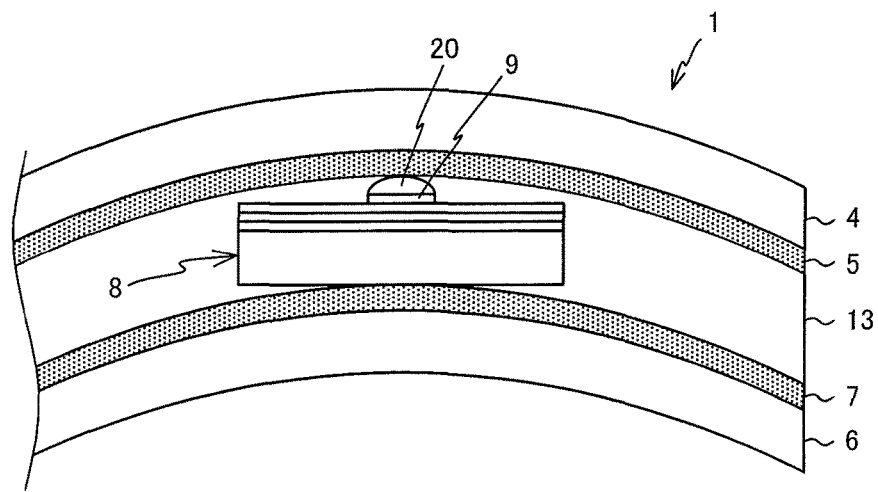
FIG. 15A is a diagram illustrating the light-emitting module in a curved state.

For example, FIG. 15A is a diagram illustrating a state in which the light-emitting module 1 according to this embodiment is curved. In addition, FIG. 15B is a diagram illustrating a state in which the light-emitting module 300 of a comparative example is curved.

As illustrated in FIG. 15A, in a case where the electrode 9 of the light-emitting element 8 is provided with the bump 20, a distance from the upper surface of the light-emitting element 8 to the conductor pattern 5 increases, so that a sufficient vertical distance is provided between the light-emitting element 8 and the conductor pattern 5. For this reason, even when the light-emitting module 1 is curved, contact between the conductor pattern 5 connected to the electrode 9 and the light-emitting element 8 is suppressed.

Figure 15B:
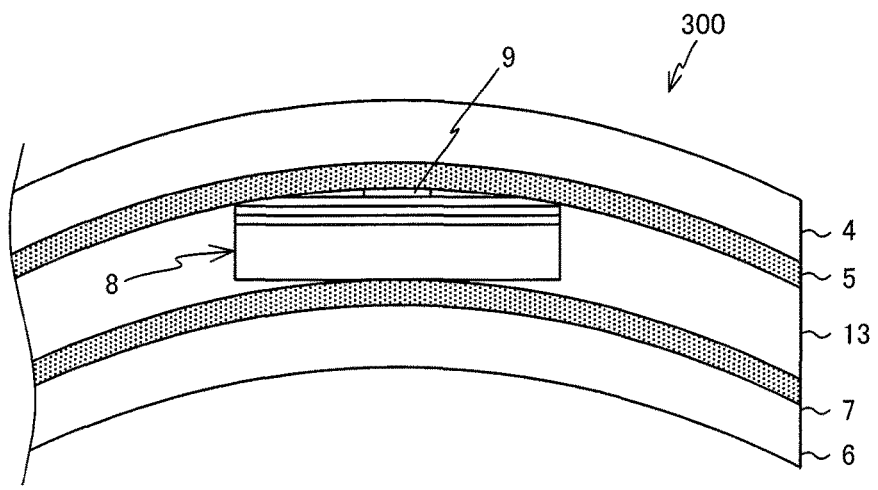
FIG. 15B is a diagram illustrating a light-emitting module of the prior art in a curved state.

Meanwhile, in a case where the electrode 9 of the light-emitting element 8 is not provided with the bump 20 as illustrated in FIG. 15B, a distance from the upper surface of the light-emitting element 8 to the conductor pattern 5 is reduced. For this reason, if the light-emitting module 300 is curved while the light-emitting layer 11 or the N-type semiconductor layer 17 is exposed from the upper surface of the light-emitting element 8, for example, as the outermost P-type semiconductor layer 16 is notched at the edge of the chip, a leakage path passing through the P-type semiconductor layer 16, the conductor pattern 5, and the N-type semiconductor layer 17 is generated between the conductor pattern 5 connected to the electrode 9 and the end of the light-emitting element 8, so that a short circuit occurs.

In the light-emitting module 1 according to this embodiment, a sufficient vertical distance is secured between the conductor pattern 5 and the light-emitting element 8 by virtue of the bump 20. Therefore, it is possible to prevent a short circuit in the circuitry.

<Manufacturing Method>

Next, a manufacturing method of the light-emitting module 1 according to an embodiment will be described.

First, a light-emitting element 8 provided with an electrode 9 in one side and an electrode 10 in the other side (anode/cathode or cathode/anode) is prepared.

Then, the bump 20 is formed in the electrode 9 of the light-emitting element 22. As a method of forming the bump 20, a technique of forming a gold bump or a gold-alloy bump from an Au wire or an Au-alloy wire using a wire bump machine may be employed. The employed wire preferably has a diameter of 15 µm or larger and 75 µm or smaller.

According to this embodiment, a wire bonding machine is employed. After forming a ball by melting the wire through discharging at a tip of the wire, the ball and the electrode 9 are connected using ultrasonic waves. Then, while the ball is connected to the electrode 9, the wire is cut out from the ball. As a result, as recognized from FIG. 6, the bump 20 is formed on the upper surface of the electrode 9 while a protrusion remains in the top end.

<Rounding Treatment>

A small protrusion in the top end of the bump 20 may remain as it is. Alternatively, rounding treatment of the bump 20 may be performed by pressing the upper surface of the bump 20 as desired. How to perform the rounding treatment is similar to that of the first embodiment.

Similarly, the rounding treatment for the light-emitting module 1 according to this embodiment may be performed using a resin sheet.

Figure 16A:
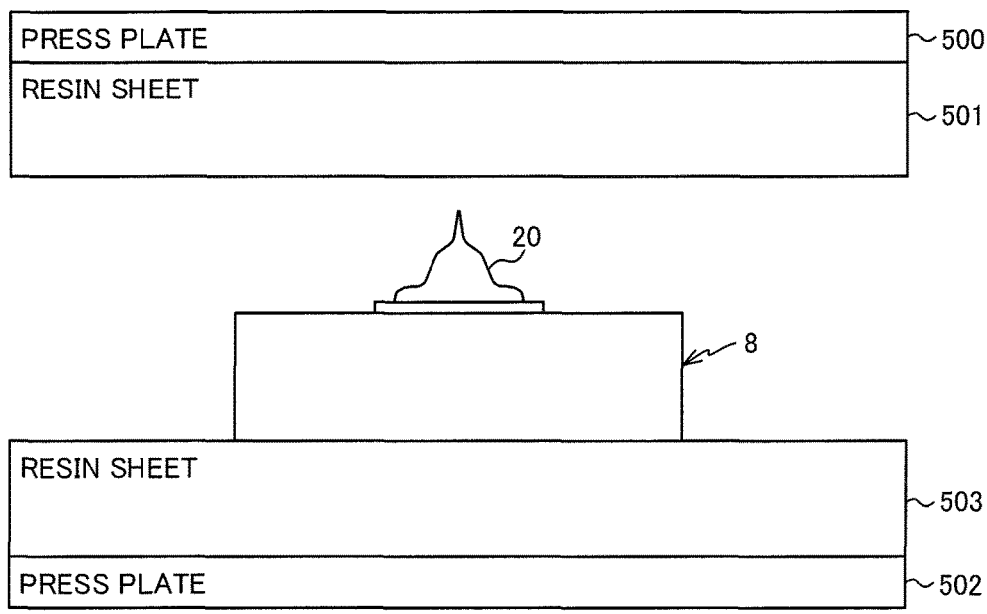
FIG. 16A is a diagram for describing bump rounding treatment.

In the rounding treatment using the resin sheet 501, for example, a press plate 500 provided with the resin sheet 501 is placed over the light-emitting element 8, and a press plate 502 provided with a resin sheet 503 is placed under the light-emitting element 8 as illustrated in FIG. 16A. Such resin sheets 501 and 503 have a thickness larger than a sum of the thickness of the light-emitting element 8 and the height B of the bump 20.

Figure 16B:
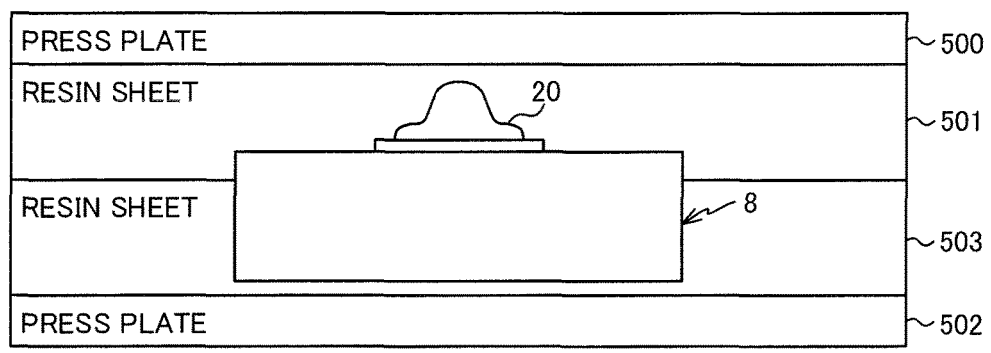
FIG. 16B is a diagram for describing bump rounding treatment.

The pressing is performed by lowering the press plate 500 and lifting the press plate 502 at the same time to interpose the light-emitting element 8. As a result, the light-emitting element 8 is buried inside the resin sheets 501 and 503 as illustrated in FIG. 16B. In this case, the bump 20 of the light-emitting element 8 is subjected to the rounding treatment to press the tail. The movement amounts of the press plates 500 and 502 during the pressing are determined depending on a target height of the bump 20.

Then, the pressing of the light-emitting element 8 is terminated, and the resin sheets 501 and 503 are removed from the light-emitting element 8. As a result, it is possible to obtain a light-emitting element 8 having the bump 20 provided with a continuous surface having a continuous curved face.

Figure 17A:
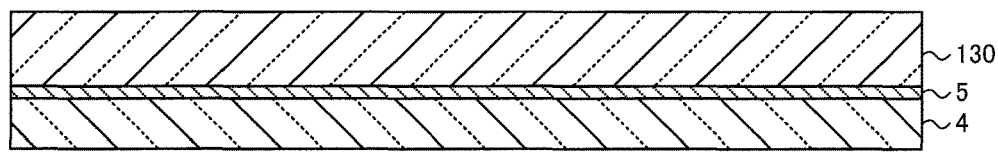
FIG. 17A is a diagram for describing a method of manufacturing a light-emitting module.

As the bump 20 is formed in the light-emitting element 8, a light transmissive film 4 provided with the conductor pattern 5 is prepared on the upper surface. In addition, as illustrated in FIG. 17A, a resin sheet 130 having light transmissive property is placed on the upper surface of the light transmissive film 4. The resin sheet 130 is temporarily attached onto the light transmissive film 4, for example, using an adhesive or the like.

Figure 17B:
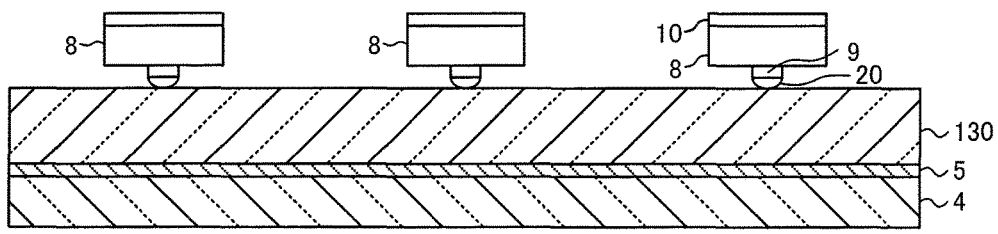
FIG. 17B is a diagram for describing a method of manufacturing the light-emitting module.

Then, the light-emitting element 8 is placed on the upper surface of the resin sheet 130 as illustrated in FIG. 17B. The light-emitting element 8 is placed such that a surface having the electrode 9 faces the light transmissive film 4. In addition, the light-emitting element 8 is positioned such that the electrode 9 is placed over the conductor patterns 5.

Figure 17C:
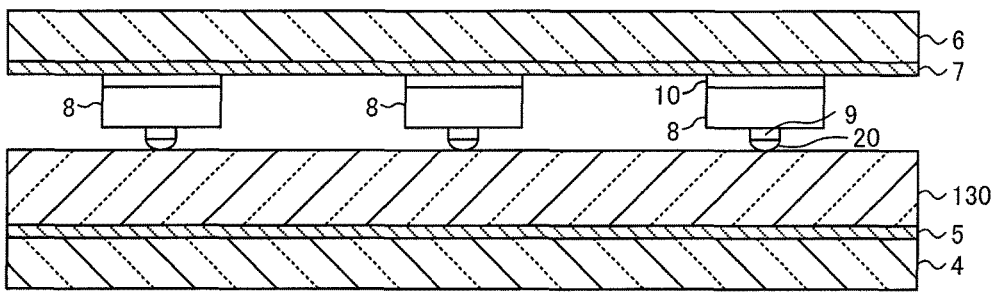
FIG. 17C is a diagram for describing a method of manufacturing the light-emitting module.

Then, the light transmissive film 6 having the conductor pattern 7 is placed over the light-emitting element 8 as illustrated in FIG. 17C. The light transmissive film 6 is placed such that the conductor pattern 7 faces the light-emitting element 8.

Then, a layered product including the light transmissive films 4 and 6, the resin sheet 130, and the light-emitting element 8 is pressed while being heated under a vacuum atmosphere. The layered product heating/pressing process under a vacuum atmosphere (vacuum thermocompression bonding process) is performed under the same condition as that of the first embodiment.

The electrode 10 and the conductor pattern 7 may make direct contact with each other or may make contact by inserting a conductive adhesive or the like.

According to this embodiment, it is possible to suppress generation of bubbles in the light-emitting module 1 on the basis of various properties of the resin layer 13, the vacuum thermocompression bonding condition, and the like. It is preferable that there be no bubble having an outer diameter equal to or larger than 500 μm or a size larger than the exterior size of the light-emitting element 8.

Figure 17D:
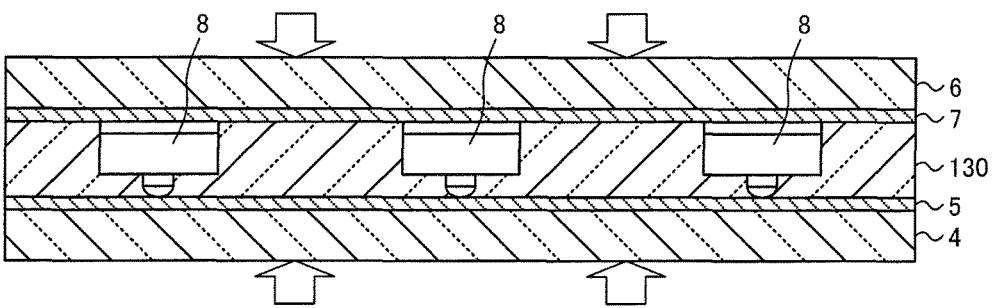
FIG. 17D is a diagram for describing a method of manufacturing the light-emitting module.

A pressing force applied during the vacuum thermocompression bonding of the layered product depends on the heating temperature, a material and thickness of the resin sheet 130, a thickness of the final resin layer 13, and the like. However, the pressing force is typically set to 0.5 to 20 MPa. In addition, the pressing force is preferably set to a range of 1 to 12 MPa. By adjusting the pressing force to the aforementioned range, it is possible to fill a softened resin sheet 130 into the gap between the light transmissive film 4 and the light transmissive film 6 as illustrated in FIG. 17D. Furthermore, it is possible to suppress degradation of a light-emitting property of the light-emitting element 8, a failure, or the like.

In this manner, by performing a vacuum thermocompression bonding process while the resin sheet 130 is interposed between the conductor pattern 5 and the electrode 9 of the light-emitting element 8, it is possible to form the resin layer 13 around the light-emitting element 8 while electrically connecting the electrode 9 and the conductor pattern 5 and electrically connecting the electrode 10 and the conductor pattern 7. In addition, for example, it is possible to appropriately fill a part of the resin layer 13 in the space between the upper surface of the light-emitting element 8 and the conductor pattern 5 as illustrated in FIG. 14. Furthermore, it is possible to suppress remaining of bubbles in the resin layer 13.

By performing the thermocompression bonding process for the layered product, the light-emitting module 1 of FIG. 12 is completed. In the manufacturing method according to this embodiment, it is possible to manufacture the light-emitting module 1 having excellent electrical connectability between the conductor patterns 5 and 7 and the electrodes 9 and 10 or reliability thereof with high reproducibility.

In this embodiment, the resin layer 13 includes a single-layered resin sheet 130. Alternatively, the resin layer 13 may include a pair of resin sheets 130. In this case, by pressing the layered product while the light-emitting element 8 is interposed between the pair of resin sheets 130, it is possible to obtain the light-emitting module 1 of FIG. 12.

EXAMPLES

Next, specific examples and their evaluation results will be described.

Table 1 of FIG. 18 shows a test result obtained by performing a bending test and a thermal cycling test for a light-emitting module having a light-emitting element 22 (LED) provided with a pair of electrodes 28 and 29 on the upper surface as illustrated in FIG. 2.

Figure 20A:
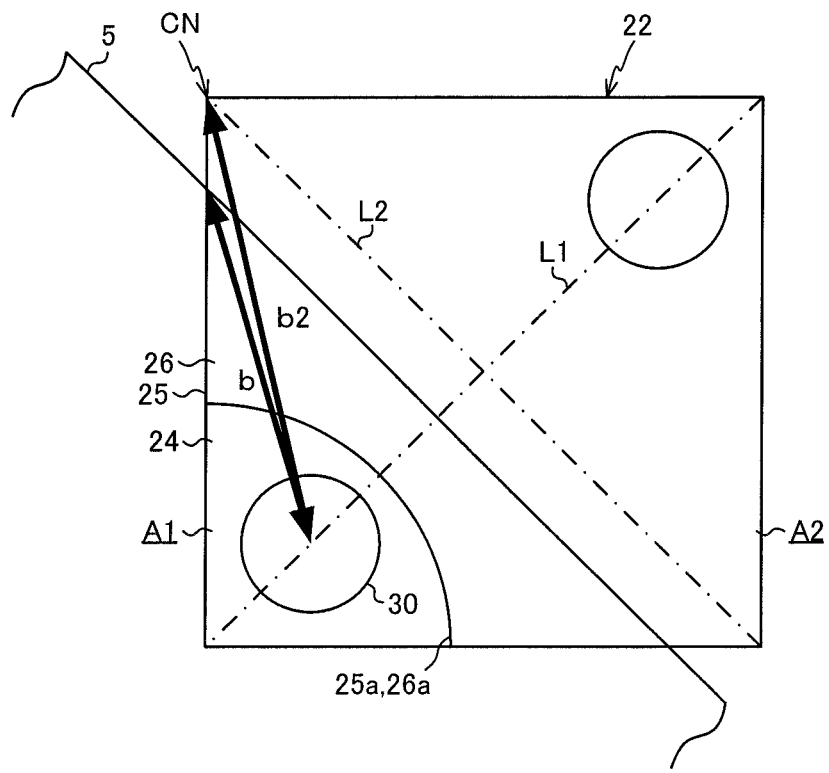
FIG. 20A is a top plan view illustrating a light-emitting element.

The "CHIP SIZE" of Table 1 refers to vertical and horizontal dimensions of the chip. The "BUMP HEIGHT" refers to a height of the bump 30. The "DISTANCE a" refers to a sum of the height of the electrode 29 (electrode pad) of the light-emitting element 22 and the height of the bump 30 (see FIG. 20C). The "CHIP AND BUMP POSITIONS" refers to a position of the bump with respect to the light-emitting element 22. The "ON DIAGONAL LINE OF CHIP AND IN CORNER" means that the center of the bump 30 is placed on a diagonal line L1 on the upper surface of the light-emitting element 22 indicated by a virtual line in the vicinity of the corner as illustrated in FIG. 20A. The distance "b" refers to a distance from the center of the bump 30 to a position where the outer edge of the conductor pattern 5 intersects with the outer edge of the upper surface of the light-emitting element 22 as illustrated in FIG. 20A. The center of the bump 30 also serves as a center of the electrode 29. In FIG. 20A, a conductor pattern 5 connected to the lower left bump 30 is illustrated, but a conductor pattern connected to the upper right bump 30 is omitted. In addition, as recognized from FIGS. 2 and 20A, on the surface of the light-emitting element 22, the region A1 serves as a region where the N-type semiconductor layer 24 is exposed, and the region A2 serves as a region where the P-type semiconductor layer 26 is exposed, with respect to the notches 25a and 25b of the active layer 25 and the P-type semiconductor layer 26.

Light-emitting modules having six light-emitting elements having sizes corresponding to the chip sizes of Examples 1 to 9 and Comparative Examples 1 to 8 were prepared. All of the light-emitting elements have a thickness of 150 μm.

In the light-emitting elements of Examples and the light-emitting elements of Comparative Examples 1 to 6, the bump was formed on the electrode as described above. Rounding treatment was applied to the bump. In addition, none of the light-emitting elements of Comparative Examples 7 and 8 has the bump formed on the electrode.

As the light transmissive films of the light-emitting modules of Examples and Comparative Examples, a polyethylene terephthalate sheet having a thickness of 180 μm was employed. A conductor pattern formed of a light transmissive conductive film (ITO) is formed in this light transmissive film.

The resin layer was formed from an acrylic elastomer sheet having a thickness of 60 μm by setting the Vicat softening temperature to 110° C., setting the melting temperature to 220° C., setting the glass transition temperature to −40° C., setting the tensile storage elasticity modulus at a temperature of 0° C. to 1.1 GPa, setting the tensile storage elasticity modulus at a temperature of 100° C. to 0.3 GPa, and setting the tensile storage elasticity modulus at the Vicat softening point of 110° C. to 0.2 GPa.

The Vicat softening temperature was obtained using a HD-PC heat distortion tester, Model No. 148, produced by Yasuda Seiki Seisakusho Co., Ltd. under the A50 condition described in JIS K7206 (ISO 306) by applying a test load of 10 N at a heating rate of 50° C./hour.

The glass transition temperature and the melting temperature were measured using a method complying with JIS K7121 (ISO 3146). The glass transition temperature and the melting temperature are values obtained by measuring a heat amount based on heat flux differential scanning calorimetry using a differential scanning calorimeter, Model No. DSC-60, produced by Shimadzu Corporation by heating a sample at a heating rate of 5° C./min.

The tensile storage elasticity modulus was measured in accordance with JIS K7244-4 (ISO 6721-4). The tensile storage elasticity modulus is a value obtained by heating a sample at a constant heating rate of 1° C./min from −100° C. to 200° C. and setting a frequency to 10 Hz using an Automatic Dynamic Viscoelastometer, Model No. DDV-01GP, produced by A&D Company, Limited.

The layered product of FIG. 10C was preliminarily pressed at a pressure of 0.1 MPa, and the work space was then evacuated in vacuum to 0.1 kPa. Then, the layered product was pressed with a pressure of 9.8 MPa while being heated to a temperature of 120° C. under a vacuum atmosphere of 5 kPa. In addition, this state was maintained for 10 minutes, so that the light transmissive film, the resin sheet, and the light-emitting element of the layered product were integrated to manufacture a light-emitting module.

The bending test and the thermal cycling test were performed by connecting an external wire to the conductor patterns of the light-emitting modules of each Example and each Comparative Example and turning on six light-emitting elements connected in series.

Six light-emitting modules were prepared for each Example and each Comparative Example. In addition, a bending test described in JIS C5016 (IEC 249-1 and IEC 326-2) 8.6 were performed for each of the light-emitting modules having a turn-on state.

The bending test was performed under an environment having a temperature of 35±2° C., a relative humidity of 60 to 70%, and an atmospheric pressure of 86 to 106 kPa. The light-emitting module was bent such that the electrode 29 side of the light-emitting module becomes convex. A minimum bending radius of the light-emitting module was investigated by bending the light-emitting module. The minimum bending radius refers to a minimum value of the radius while the turn-on state of the light-emitting module is maintained.

Specifically, a plurality of types of cylinders having diameters from 100 mm to 5 mm in radius were prepared. Then, the lower surface (the lower surface in FIGS. 5A and 5B) of the obtained light emitting module abutted on the surfaces of the cylinders in order from the surface of the cylinder having the larger radius to the surface of the cylinder having the smaller radius. Then, the radius of the smallest cylinder when the turn-on state of the light emitting module is maintained was determined as the minimum bending radius.

As illustrated in Table 1, the minimum bending radiuses of all of the light-emitting modules of Examples 1 to 9 were equal to or smaller than 20 mm. Meanwhile, none of the light-emitting modules of Comparative Examples 1 to 8 has a bending radius equal to or smaller than 20 mm. From this result, it was recognized that the electrical connection reliability between the conductor pattern of the light-emitting module and the electrode of the light-emitting element was remarkably improved if the ratio "a/b" is equal to or higher than 0.1.

The thermal cycling test was performed 3,000 times at a temperature between −30° C. and 60° C. in accordance with JIS C60068-14 to investigate the turn-on state maintaining status. The thermal cycling test was performed by setting a baking time to 30 minutes and setting a heating rate to 3 K/min. As shown in Table 1, the turn-on state was maintained in all of the light-emitting modules of Examples 1 to 7. In comparison, none of the light-emitting modules of Comparative Examples 1 to 8 maintains the turn-on state.

From the aforementioned result, it was proved that the reliability of the light-emitting module can be improved by forming the bump in the light-emitting element. In addition, in a case where the light-emitting module includes a light-emitting element having an electrode formed on only a single surface as illustrated in FIG. 2, it was proved that the ratio "a/b" between the distance "a" obtained by adding the height of the electrode 29 of the light-emitting element 22 and the height of the bump 30 and the distance "b" from the center of the bump 30, that is, the center of the electrode 29 to a position where the outer edge of the conductor pattern intersects with the outer edge on the upper surface of the light-emitting element is preferably set to 0.1 or greater.

Note that, focusing on reduction of the minimum bending radius, it is preferable to increase the ratio "a/b." However, if the height of the bump increases, it becomes difficult to manufacture the bump. In the case of a single-layered bump, the bump height is preferably set to be shorter than 60 μm or be equal to or shorter than 50 μm. In addition, as the height of the bump increases, the chip becomes unstable in the pressing process. For this reason, the ratio "a/b" is preferably set to be equal to or smaller than 0.4 even by considering a combination of the distances "a" and "b." Therefore, a preferable range of the ratio "a/b" in consideration of the upper limit is set to 0.10 to 0.40. Referring to Table 1, the preferable range is 0.10 to 0.30.

From the aforementioned result, it can be said that a ratio "a/b2" between the distance "a" obtained by adding the height of the electrode 29 and the height of the bump 30 and the distance "b2" from the center of the bump (the center of the electrode 29) to a far side corner CN of a side adjacent to the bump is preferably set to a range equal to or larger than 0.1, a range of 0.10 to 0.40, or a range of 0.10 to 0.30. Typically, since a space for the conductor pattern is necessary between the electrodes, the side (outer edge) of the conductor pattern 5 of the electrode 29 side does not exceed the diagonal line L2 of the chip.

Table 2 of FIG. 19 shows a test result obtained by performing a bending test and a thermal cycling test for the light-emitting module having the light-emitting element 8 having electrodes 9 and 10 on each of the upper and lower surfaces as illustrated in FIG. 13.

Figure 20B:
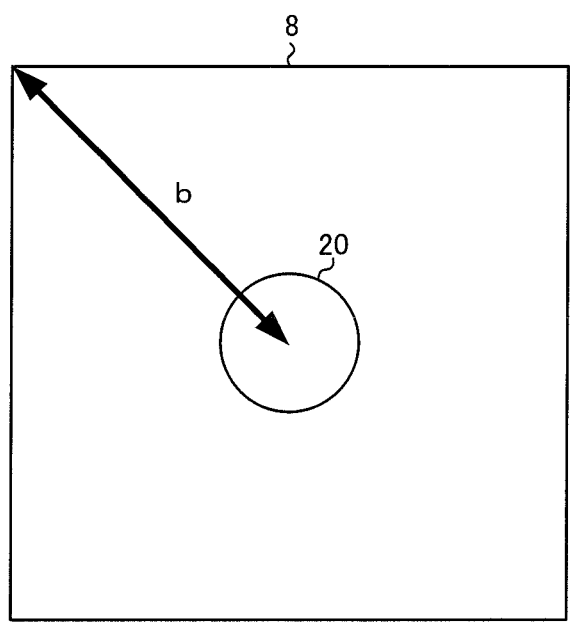
FIG. 20B is a top plan view illustrating a light-emitting element.
Figure 20C:
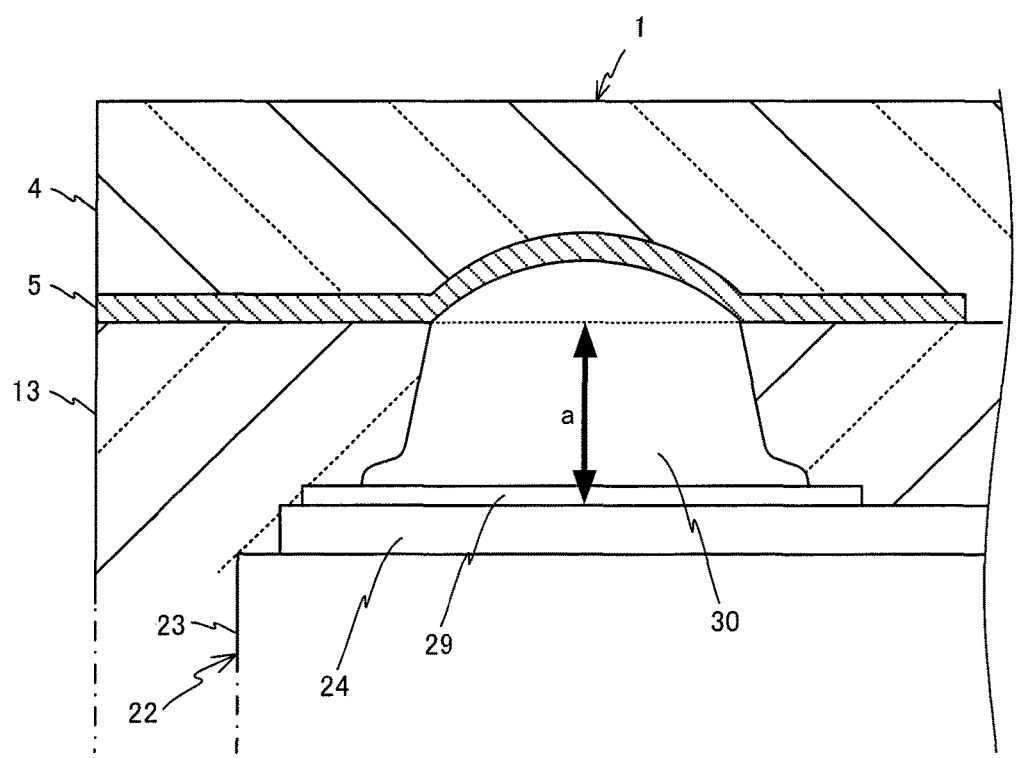
FIG. 20C is a cross-sectional view illustrating a light-emitting element.

The "CHIP SIZE" of Table 2 refers to horizontal and vertical dimensions of the chip. The "BUMP HEIGHT" refers to a height of the bump 20. The "DISTANCE a" refers to a sum of the height of the electrode 9 of the light-emitting element 8 and the height of the bump 20 (refer to FIG. 20C). The "CHIP AND BUMP POSITIONS" refers to a position of the bump with respect to the light-emitting element 8. The "CENTER OF CHIP" means that the bump 20 is placed in the center of the upper surface of the light-emitting element 8 as illustrated in FIG. 20B. In addition, the "¾ POSITION FROM UPPER END OF DIAGONAL LINE OF CHIP" refers to a position closest to the corner out of three points obtained by quartering the diagonal line on the surface of the light-emitting element. The "DISTANCE b" refers to a distance from the center of the bump 20 to the corner of the upper surface of the light-emitting element as illustrated in FIG. 20B.

Light-emitting modules having six light-emitting elements having sizes corresponding to the chip sizes of Examples 1 to 7 and Comparative Examples 1 to 9 were prepared. All of the light-emitting elements have a thickness of 150 µm.

In the light-emitting elements of Examples and the light-emitting elements of Comparative Examples 1 to 7, the bump was formed on the electrode as described above. Rounding treatment was applied to the bump. In addition, none of the light-emitting elements of Comparative Examples 7 and 8 has the bump formed on the electrode.

As the light transmissive films of the light-emitting modules of Examples and Comparative Examples, a polyethylene terephthalate sheet having a thickness of 180 µm was employed. A conductor pattern formed of a light transmissive conductive film (ITO) is formed in this light transmissive film.

The resin layer was formed from an acrylic elastomer sheet having a thickness of 60 µm by setting the Vicat softening temperature to 110° C., setting the melting temperature to 220° C., setting the glass transition temperature to −40° C., setting the tensile storage elasticity modulus at a temperature of 0° C. to 1.1 GPa, setting the tensile storage elasticity modulus at a temperature of 100° C. to 0.3 GPa, and setting the tensile storage elasticity modulus at the Vicat softening point of 110° C. to 0.2 GPa.

The layered product of FIG. 17C was preliminarily pressed at a pressure of 0.1 MPa, and the work space was then evacuated in vacuum to 0.1 kPa. Then, the layered product was pressed with a pressure of 9.8 MPa while being heated to a temperature of 120° C. under a vacuum atmosphere of 5 kPa. In addition, this state was maintained for 10 minutes, so that the light transmissive film, the resin sheet, and the light-emitting element of the layered product were integrated to manufacture a light-emitting module.

The bending test and the thermal cycling test were performed by connecting an external wire to the conductor patterns of the light-emitting modules of each Example and each Comparative Example and turning on six light-emitting elements connected in series.

Six light-emitting modules were prepared for each Example and each Comparative Example. In addition, a bending test described in JIS C5016 (IEC 249-1 and IEC 326-2) 8.6 were performed for each of the light-emitting modules having a turn-on state.

The bending test was performed under an environment having a temperature of 35±2° C., a relative humidity of 60 to 70%, and an atmospheric pressure of 86 to 106 kPa. The light-emitting module was bent such that the electrode 9 side of the light-emitting module 1 becomes convex. A minimum bending radius of the light-emitting module was investigated by bending the light-emitting module.

Specifically, a plurality of types of cylinders having diameters from 100 mm to 5 mm in radius were prepared. Then, the lower surface (the lower surface in FIGS. 15A and 51B) of the obtained light emitting module abutted on the surfaces of the cylinders in order from the surface of the cylinder having the larger radius to the surface of the cylinder having the smaller radius. Then, the radius of the smallest cylinder when the turn-on state of the light emitting module is maintained was determined as the minimum bending radius.

As illustrated in Table 2, the minimum bending radiuses of all of the light-emitting modules of Examples 1 to 7 were equal to or smaller than 20 mm. Meanwhile, none of the light-emitting modules of Comparative Examples 1 to 9 has a bending radius equal to or smaller than 20 mm. From this result, it was recognized that the electrical connection reliability between the conductor pattern and the electrode of the light-emitting element of the light-emitting module was remarkably improved if the ratio "a/b" is equal to or higher than 0.12.

The thermal cycling test was performed 3,000 times at a temperature between −30° C. and 60° C. in accordance with JIS C60068-14 to investigate the turn-on state maintaining status. The thermal cycling test was performed by setting a baking time to 30 minutes and setting a heating rate to 3 K/min. As shown in Table 2, the turn-on state was maintained in all of the light-emitting modules of Examples 1 to 7. In comparison, none of the light-emitting modules of Comparative Examples 1 to 9 maintains the turn-on state.

From the aforementioned result, it was proved that the reliability of the light-emitting module can be improved by forming the bump in the light-emitting element. In addition, in a case where the light-emitting module includes a light-emitting element having an electrode formed on only a single surface as illustrated in FIG. 13, it was proved that the ratio "a/b" between the distance "a" obtained by adding the height of the electrode 9 of the light-emitting element 8 and the height of the bump 20 and the distance "b" from the center of the bump (the center of the electrode 9) to the corner of the upper surface of the light-emitting element is preferably set to 0.12 or greater.

Here, the lower limit of the ratio "a/b" is smaller in Examples of Table 1 because, if a pair of electrodes are on a single side, the center of the bump is closer to the edge of the chip, so that the value of "b" can be larger.

Note that, focusing on reduction of the minimum bending radius, it is preferable to increase the ratio "a/b." However, if the height of the bump increases, it becomes difficult to manufacture the bump. In addition, the chip becomes unstable in the pressing process. For this reason, the ratio "a/b" is preferably set to be equal to or smaller than 0.4, and the bump height is preferably set to be shorter than 60 µm or be equal to or shorter than 50 µm.

In Examples of Tables 1 and 2, a light transmissive conductive film (ITO) is employed as the conductor pattern 5. However, the same result is obtained even by using a mesh conductor pattern formed of an opaque metal material as the conductor pattern 5. Even when the conductor pattern is a mesh pattern, and the light-emitting element of the light-emitting module has a pair of electrodes on a single side as shown in Table 1, the conductor pattern makes contact with one of the P-type semiconductor layer and the N-type semiconductor layer of the light-emitting element, and is placed over the other side of the P-type semiconductor layer and the N-type semiconductor layer. For this reason, even when the conductor pattern of the light-emitting module is a mesh pattern, the same effect as that of the light-emitting module having the conductor pattern formed of ITO can be obtained.

While embodiments of the present disclosure have been described hereinbefore, the invention is not limited to the embodiments described above. For example, the bump may include various types of bumps such as a lift-off bump other than the wire bump using the wire bonder.

For example, the bump may be formed of a mixture of metal fine particles and resin. In this case, for example, metal such as silver (Ag) or copper (Cu) and alloy thereof may be mixed with thermoplastic resin to form a paste, and a small droplet of the paste may be sprayed to the electrode using ink jet method or a needle application method to form a protrusion. Then, the protrusion may be cured through baking to form a conductive layer bump.

While several embodiments of the present disclosure have been described, these embodiments have been proposed by way of example and are not intended to limit the scope of the invention. These novel embodiments can be implemented in various other forms, and various omissions, substitutions, and changes can be possible without departing from the spirit and scope of the invention. These embodiments and modifications thereof are included in the scope and gist of the invention and encompass the inventions described in the claims and the equivalents thereof.

The invention claimed is:

1. A light-emitting module comprising:
   a first flexible insulating substrate;
   at least first and second conductor patterns;
   at least a first light-emitting element;
   at least first and second electrodes; and
   at least first and second bumps,
   the first light-emitting element comprising a P-type semiconductor layer and an N-type semiconductor layer,
   one of the P-type semiconductor layer and the N-type semiconductor layer:
      does not cover the other of the P-type semiconductor layer and the N-type semiconductor layer in a first region of the light-emitting element, and
      covers the other of the P-type semiconductor layer and the N-type semiconductor layer in a second region of the light-emitting element,
   each of the first and second conductor patterns is on the first flexible insulating substrate,
   the first electrode is on the first region of the light emitting element, facing the first insulating substrate,
   the first electrode is connected to the first conductor pattern through the first bump,
   the second electrode is on the second region of the light emitting element, facing the first insulating substrate,
   the second electrode is connected to the second conductor pattern through the second bump,
   wherein a ratio of (a) the shortest distance between (i) the light-emitting element and (ii) a point of contact, between the first bump and the first conductor pattern, that is closest to the light-emitting element, divided by (b) a distance, along a first plane defined by a surface of the first region that faces the first flexible insulating substrate, from an axis that extends perpendicular to the first plane and through a center of the first bump to a position where a second plane defined by an outer edge of the first conductor pattern intersects with an edge of the second region, is equal to or greater than 0.1.

2. The light-emitting module according to claim 1, wherein the ratio is equal to or greater than 0.10 and equal to or smaller than 0.40.

3. The light-emitting module according to claim 1, wherein the ratio is equal to or greater than 0.10 and equal to or smaller than 0.30.

4. The light-emitting module according to claim 1, wherein a height of the first bump to a contact point of the first conductor pattern is shorter than 60 µm.

5. The light-emitting module according to claim 1, wherein a height of the first bump to a contact point of the first conductor pattern is equal to or shorter than 50 µm.

6. The light-emitting module according to claim 1, wherein a height of the first bump is equal to or longer than 5 µm and equal to or shorter than 50 µm.

7. The light-emitting module according to claim 1, wherein the first bump is formed of gold, silver, copper, nickel, or any one of alloys thereof.

8. The light-emitting module according to claim 7, wherein the alloy includes AuSn alloy or nickel alloy.

9. The light-emitting module according to claim 1, wherein the first bump is formed of a mixture of metal fine particles and resin.

10. The light-emitting module according to claim 1, wherein the first bump has a melting point equal to or higher than 180° C.

11. The light-emitting module according to claim 1, wherein the first bump has a dynamic hardness equal to or higher than 3 and equal to or lower than 150.

12. The light-emitting module according to claim 1, wherein the first bump has an upper surface subjected to rounding treatment.

13. The light-emitting module according to claim 1, wherein the first conductor pattern passes through a portion of the second region.

14. The light-emitting module according to claim 1, wherein the first conductor pattern is formed from a light transmissive conductive film or a conductor mesh.

15. A light-emitting module comprising:
   a first flexible insulating substrate;
   at least first and second conductor patterns;
   at least a first light-emitting element;
   at least first and second electrodes; and
   at least first and second bumps,
   the first light-emitting element comprising a P-type semiconductor layer and an N-type semiconductor layer,
   one of the P-type semiconductor layer and the N-type semiconductor layer:
      does not cover the other of the P-type semiconductor layer and the N-type semiconductor layer in a first region of the light-emitting element, and
      covers the other of the P-type semiconductor layer and the N-type semiconductor layer in a second region of the light-emitting element,
   each of the first and second conductor patterns is on the first flexible insulating substrate,
   the first electrode is on the first region of the light emitting element, facing the first insulating substrate,
   the first electrode is connected to the first conductor pattern through the first bump,
   the second electrode is on the second region of the light emitting element, facing the first insulating substrate,
   the second electrode is connected to the second conductor pattern through the second bump,
   wherein a ratio of (a) the shortest distance between (i) the light-emitting element and (ii) a point of contact, between the first bump and the first conductor pattern, that is closest to the light-emitting element, divided by (b) a distance, along a first plane defined by a surface of the first region that faces the first flexible insulating substrate, from an axis that extends perpendicular to the first plane and through a center of the first bump to a far side corner of the light emitting element, said far side corner being the farthest corner of the light emitting element that is on a surface of the light emitting element that faces the first flexible insulating substrate and on an edge of the light emitting element that is adjacent to the first electrode, is equal to or greater than 0.1.

* * * * *